United States Patent
Lee et al.

(10) Patent No.: US 11,056,445 B2
(45) Date of Patent: Jul. 6, 2021

(54) PACKAGE STRUCTURE WITH BUFFER LAYER SANDWICHED BETWEEN ENCAPSULATION LAYER AND SEMICONDUCTOR SUBSTRATE

(71) Applicant: TAIWAN SEMICONDUCTOR MANUFACTURING CO., LTD., Hsinchu (TW)

(72) Inventors: Hsiao-Wen Lee, Hsinchu (TW);
Hsien-Wen Liu, Hsinchu (TW);
Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/731,517

(22) Filed: Dec. 31, 2019

(65) Prior Publication Data

US 2020/0135661 A1 Apr. 30, 2020

Related U.S. Application Data

(62) Division of application No. 15/640,695, filed on Jul. 3, 2017, now Pat. No. 10,529,671.

(Continued)

(51) Int. Cl.
*H01L 23/495* (2006.01)
*H01L 23/00* (2006.01)
(Continued)

(52) U.S. Cl.
CPC ........ *H01L 23/562* (2013.01); *H01L 21/0223* (2013.01); *H01L 21/3043* (2013.01); *H01L 21/48* (2013.01); *H01L 21/4853* (2013.01); *H01L 21/4857* (2013.01); *H01L 21/56* (2013.01); *H01L 21/561* (2013.01);
(Continued)

(58) Field of Classification Search
CPC . H01L 23/562; H01L 21/3043; H01L 21/486; H01L 21/4857; H01L 21/4853; H01L 21/0223; H01L 21/78; H01L 21/6835; H01L 21/561; H01L 21/565; H01L 23/3135; H01L 23/3192; H01L 23/3178; H01L 23/5386; H01L 23/5384;
(Continued)

(56) References Cited

U.S. PATENT DOCUMENTS

| 6,107,164 A | 8/2000 | Ohuchi |
| 6,338,980 B1 | 1/2002 | Satoh |

(Continued)

*Primary Examiner* — Ismail A Muse
(74) *Attorney, Agent, or Firm* — Birch, Stewart, Kolasch & Birch, LLP

(57) ABSTRACT

Package structures are provided. A package structure includes an adhesive layer and a semiconductor substrate over the adhesive layer. The package structure also includes a connector over the semiconductor substrate. The package structure further includes a first buffer layer surrounding the connector. In addition, the package structure includes an encapsulation layer surrounding the first buffer layer. The first buffer layer is sandwiched between the encapsulation layer and the semiconductor substrate, and a sidewall of the encapsulation layer is in direct contact with a sidewall of the first buffer layer and a sidewall of the adhesive layer. The package structure also includes a redistribution layer over the first buffer layer and the encapsulation layer.

20 Claims, 28 Drawing Sheets

Related U.S. Application Data

(60) Provisional application No. 62/433,382, filed on Dec. 13, 2016.

(51) Int. Cl.

| | | |
|---|---|---|
| *H01L 23/538* | (2006.01) | |
| *H01L 23/31* | (2006.01) | |
| *H01L 21/304* | (2006.01) | |
| *H01L 21/56* | (2006.01) | |
| *H01L 21/683* | (2006.01) | |
| *H01L 21/78* | (2006.01) | |
| *H01L 21/02* | (2006.01) | |
| *H01L 21/48* | (2006.01) | |
| *H01L 23/498* | (2006.01) | |

(52) U.S. Cl.
CPC ........ *H01L 21/565* (2013.01); *H01L 21/6835* (2013.01); *H01L 21/78* (2013.01); *H01L 23/3135* (2013.01); *H01L 23/3178* (2013.01); *H01L 23/3192* (2013.01); *H01L 23/5383* (2013.01); *H01L 23/5386* (2013.01); *H01L 23/5389* (2013.01); *H01L 24/18* (2013.01); *H01L 21/486* (2013.01); *H01L 21/568* (2013.01); *H01L 23/3128* (2013.01); *H01L 23/49816* (2013.01); *H01L 23/5384* (2013.01); *H01L 2221/6834* (2013.01); *H01L 2221/68318* (2013.01); *H01L 2221/68327* (2013.01); *H01L 2221/68359* (2013.01); *H01L 2221/68372* (2013.01); *H01L 2221/68381* (2013.01); *H01L 2224/118* (2013.01)

(58) Field of Classification Search
CPC ............. H01L 23/5383; H01L 23/5389; H01L 2221/68327
See application file for complete search history.

(56) References Cited

U.S. PATENT DOCUMENTS

| | | | |
|---|---|---|---|
| 6,649,445 | B1 | 11/2003 | Qi et al. |
| 7,176,506 | B2 | 2/2007 | Beroz et al. |
| 7,727,875 | B2 | 6/2010 | Shin et al. |
| 7,838,424 | B2 | 11/2010 | Karta et al. |
| 8,535,978 | B2 | 9/2013 | Scanlan |
| 9,000,584 | B2 | 4/2015 | Lin et al. |
| 9,029,199 | B2 | 5/2015 | Sakurada |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,324,688 | B2 | 4/2016 | Sung et al. |
| 9,368,460 | B2 | 6/2016 | Yu et al. |
| 9,372,206 | B2 | 6/2016 | Wu et al. |
| 9,460,987 | B2 | 10/2016 | Hung et al. |
| 9,496,189 | B2 | 11/2016 | Yu et al. |
| 10,177,111 | B2 | 1/2019 | Kamphuis et al. |
| 2003/0143819 | A1 | 7/2003 | Hedler et al. |
| 2004/0113283 | A1 | 6/2004 | Farnworth et al. |
| 2005/0048759 | A1* | 3/2005 | Hsu ........................ H01L 24/24 438/618 |
| 2005/0148160 | A1 | 7/2005 | Farnworth et al. |
| 2006/0249828 | A1 | 11/2006 | Hong |
| 2006/0284285 | A1 | 12/2006 | Fukazawa |
| 2007/0273046 | A1 | 11/2007 | Theuss |
| 2008/0136002 | A1* | 6/2008 | Yang ........................ H01L 24/82 257/686 |
| 2008/0197469 | A1* | 8/2008 | Yang ........................ H01L 24/19 257/686 |
| 2008/0217761 | A1* | 9/2008 | Yang ........................ H01L 25/50 257/700 |
| 2008/0248614 | A1* | 10/2008 | Yang ................... H01L 23/3128 438/118 |
| 2008/0274579 | A1* | 11/2008 | Yang ................... H01L 31/0203 438/64 |
| 2009/0302465 | A1 | 12/2009 | Huang |
| 2010/0140782 | A1 | 6/2010 | Kim et al. |
| 2012/0142165 | A1 | 6/2012 | Huang et al. |
| 2013/0037935 | A1 | 2/2013 | Xue et al. |
| 2013/0059420 | A1 | 3/2013 | Goto et al. |
| 2013/0164911 | A1 | 6/2013 | Ito et al. |
| 2015/0357256 | A1* | 12/2015 | Suthiwongsunthorn ..................... H01L 21/566 257/734 |
| 2016/0013076 | A1* | 1/2016 | Vincent ................. H01L 25/105 |
| 2016/0093580 | A1 | 3/2016 | Scanlan et al. |
| 2016/0322343 | A1 | 11/2016 | Scanlan |
| 2017/0084539 | A1* | 3/2017 | Gao ........................ H01L 21/486 |
| 2017/0294422 | A1 | 10/2017 | Solimando et al. |

* cited by examiner

PACKAGE STRUCTURE WITH BUFFER LAYER SANDWICHED BETWEEN ENCAPSULATION LAYER AND SEMICONDUCTOR SUBSTRATE

CROSS REFERENCE TO RELATED APPLICATIONS

This application is a Divisional application of U.S. patent application Ser. No. 15/640,695, filed on Jul. 3, 2017, the entirety of which is incorporated by reference herein. The U.S. patent application Ser. No. 15/640,695 claims the benefit of U.S. Provisional Application No. 62/433,382 filed on Dec. 13, 2016, the entirety of which is incorporated by reference herein.

BACKGROUND

With the constant evolution of semiconductor technology, semiconductor dies are becoming increasingly smaller. More functions, however, need to be integrated into these semiconductor dies. Accordingly, these semiconductor dies have increasingly greater numbers of I/O pads packaged into smaller areas, and the density of the I/O pads is quickly rising. As a result, the packaging of semiconductor dies is becoming more challenging.

Packaging technologies can be divided into multiple categories. In one of the categories of packaging, dies are sawed from wafers before they are packaged onto other wafers, and "known-good-dies" are packaged. An advantage of this packaging technology is the possibility of forming fan-out chip packages, which means that the I/O pads on a die can be redistributed to a greater area than the die itself. Therefore, the number of I/O pads packed on the surfaces of the dies can be increased.

New packaging technologies have been developed to further improve the density and functions of semiconductor dies. These relatively new types of packaging technologies for semiconductor dies face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
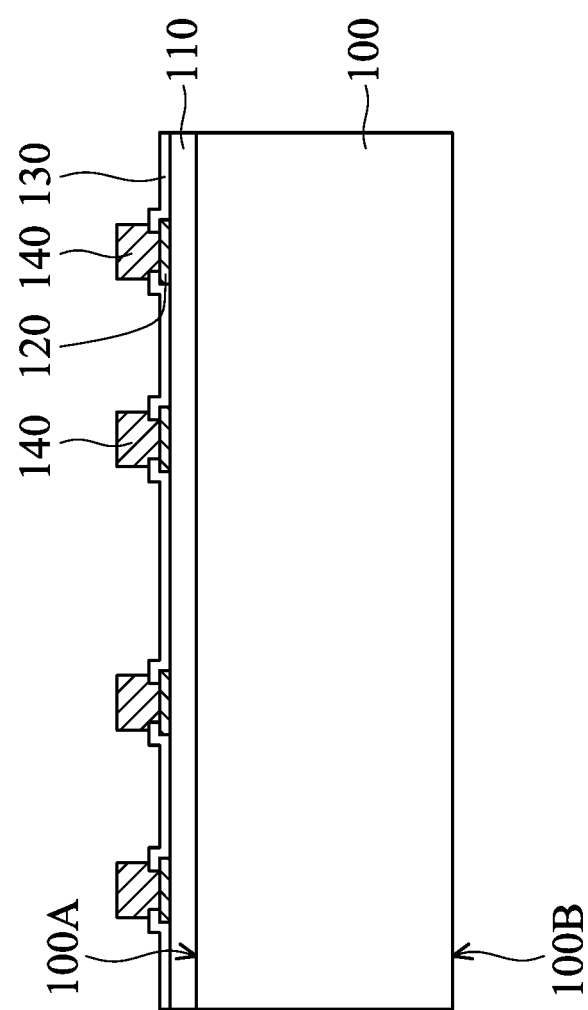
FIGS. 1A-1K are cross-sectional views of various stages of a process for forming a package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments for package structures and methods for forming the same are described. The package structures may be applied to wafer level package (WLP).

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known-good-dies to increase the yield and decrease costs.

FIGS. 1A-1K are cross-sectional views of various stages of a process for forming a package structure, in accordance with some embodiments. Although some embodiments are discussed with operations performed in a particular order, these operations may be performed in another logical order. Additional operations can be provided before, during, and/or after the stages described in FIGS. 1A-1K. Some of the stages that are described can be replaced or eliminated for different embodiments. Additional features can be added to the package structure. Some of the features described below can be replaced or eliminated for different embodiments.

As shown in FIG. 1A, a semiconductor substrate 100 is provided, in accordance with some embodiments. The semiconductor substrate 100 may be a wafer substrate. For a better understanding of the structure, the semiconductor substrate 100 is partially shown in figures. In some embodiments, the semiconductor substrate 100 includes silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof. In some embodiments, the semiconductor substrate 100 has a coefficient-of-thermal-expansion (CTE) in a range from about 2.5 ppm/° C. to about 3.2 ppm/° C. However, embodiments of the disclosure are not limited thereto.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

Various active elements (not shown) are formed in and/or over the semiconductor substrate 100, in accordance with some embodiments. Examples of the various active elements include transistors, diodes, another suitable element, or a combination thereof. The transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc. Various passive elements (not shown) may also be formed in and/or over the semiconductor substrate 100. Examples of the various passive elements include capacitors, inductors, resistors, another suitable passive element, or a combination thereof.

Active and/or passive elements are formed over a surface 100A of the semiconductor substrate 100, which may be referred to as an active surface. Active and/or passive elements may be formed in and/or over the semiconductor substrate 100 using front-end semiconductor fabrication processes, which may be referred to as front end of line (FEOL) processes. Subsequently, an interconnection structure may be formed over the semiconductor substrate 100 using back-end semiconductor fabrication processes, which may be referred to as back end of line (BEOL) processes.

For example, a dielectric layer 110 is formed over the surface 100A of the semiconductor substrate 100, as shown in FIG. 1A in accordance with some embodiments. The dielectric layer 110 covers active and/or passive elements over the semiconductor substrate 100. The dielectric layer 110 may be a multi-layer structure (not shown), which includes an interlayer dielectric (ILD) layer and one or more inter-metal dielectric (IMD) layers. Multiple conductive features (not shown) are formed in the ILD layer and IMD layers and electrically connected to active or passive elements in and/or over the semiconductor substrate 100. Examples of the conductive features include conductive contacts, conductive lines and/or conductive vias.

In some embodiments, the dielectric layer 110 is made of silicon oxide, silicon oxynitride, borosilicate glass (BSG), phosphoric silicate glass (PSG), borophosphosilicate glass (BPSG), fluorinated silicate glass (FSG), low-K material, porous dielectric material, another suitable dielectric material, or a combination thereof. The material of the dielectric layer 110 is selected to minimize size, propagation delays, and crosstalk between nearby conductive features. In some embodiments, the dielectric layer 110 has a CTE in a range from about 15 ppm/° C. to about 50 ppm/° C. However, embodiments of the disclosure are not limited thereto.

As shown in FIG. 1A, conductive pads 120 are formed over the dielectric layer 110, in accordance with some embodiments. The conductive pads 120 are electrically connected to active or passive elements in and/or over the semiconductor substrate 100 through the conductive features in the dielectric layer 110. In some embodiments, the conductive pads 120 include aluminum (Al), copper (Cu), silver (Ag), gold (Au), nickel (Ni), tungsten (W), another suitable material, or a combination thereof.

As shown in FIG. 1A, a passivation layer 130 is formed over the dielectric layer 110, in accordance with some embodiments. The passivation layer 130 partially covers the conductive pads 120. The conductive pads 120 are partially exposed by openings of the passivation layer 130, which are not shown in FIG. 1A. Although FIG. 1A shows that the passivation layer 130 is a single layer, embodiments of the disclosure are not limited thereto. In some other embodiments, the passivation layer 130 is a multi-layer structure including sub-layers (not shown).

In some embodiments, the passivation layer 130 is made of silicon oxide, silicon nitride, silicon oxynitride, polyimide (PI), polybenzoxazole (PBO), benzocyclobutene (BCB), another suitable dielectric material, or a combination thereof. In some embodiments, the passivation layer 130 has a CTE in a range from about 15 ppm/° C. to about 50 ppm/° C. However, embodiments of the disclosure are not limited thereto.

As shown in FIG. 1A, connectors 140 are formed over the passivation layer 130, in accordance with some embodiments. The connectors 140 are physically and electrically connected to the exposed conductive pads 120 through the openings of the passivation layer 130. The connectors 140 may be conductive vias, conductive pillars or other suitable connectors. In some embodiments, the connectors 140 include Cu, W, Ag, Au, another suitable material, or a combination thereof.

Figure 1B:
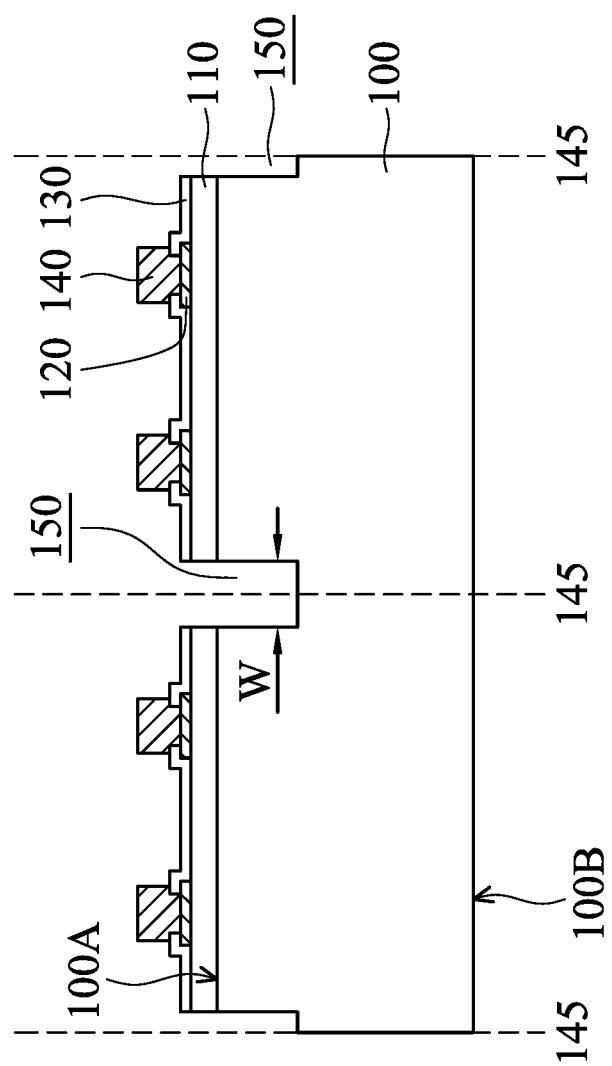

As shown in FIG. 1B, the passivation layer 130, the dielectric layer 110 and the semiconductor substrate 100 are partially removed, in accordance with some embodiments. As a result, trenches 150 are formed in the passivation layer 130, the dielectric layer 110 and the semiconductor substrate 100. The trenches 150 penetrate through the passivation layer 130 and the dielectric layer 110, and extend from the surface 100A towards an opposite surface 100B of the semiconductor substrate 100. The surface 100B may be referred to as a non-active surface.

In some embodiments, the trenches 150 have a width W in a range from about 60 μm to about 80 μm. However, embodiments of the disclosure are not limited thereto. In some embodiments, the trenches 150 are formed using a dicing process, an etching process, or another applicable process. For example, the passivation layer 130, the dielectric layer 110 and the semiconductor substrate 100 may be cut along scribe lines 145 to form the trenches 150. In some embodiments, the trenches 150 are substantially aligned to the scribe lines 145. In some embodiments, the trenches 150 continuously extend along the scribe lines 145 and surround the conductive pads 120 in a top view (not shown).

Figure 1C:
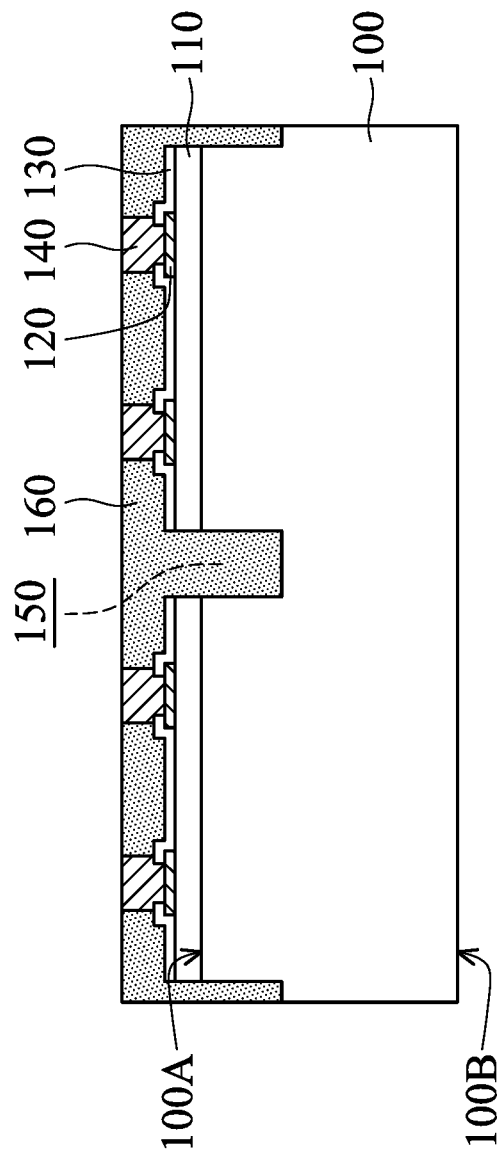

As shown in FIG. 1C, a buffer layer 160 is deposited over the passivation layer 130, in accordance with some embodiments. The buffer layer 160 fills up the trenches 150. As a result, the connectors 140, the passivation layer 130, the dielectric layer 110 and the semiconductor substrate 100 are surrounded by the buffer layer 160. In some embodiments, the buffer layer 160 adjoins the connectors 140. The buffer layer 160 can improve the reliability of the package structure, which will be described in more detail later.

Although FIG. 1C shows that the buffer layer 160 is a single layer, embodiments of the disclosure are not limited thereto. The buffer layer 160 may be a multi-layer structure including sub-layers (not shown). In some embodiments, the buffer layer 160 is made of PI, PBO, BCB, resin, epoxy, another suitable dielectric material, or a combination thereof. The buffer layer 160 may be made of a material containing fillers dispersed therein, such as an underfill material or a molding compound material. The fillers may include insulating fibers, insulating particles, other suitable elements, or a combination thereof.

In some embodiments, the buffer layer 160 has a CTE in a range from about 12 ppm/° C. to about 50 ppm/° C. For example, the CTE of the buffer layer 160 may be in a range from about 15 ppm/° C. to about 30 ppm/° C. However, embodiments of the disclosure are not limited thereto. In some embodiments, the CTE of the buffer layer 160 is greater than the CTE of the semiconductor substrate 100. The CTE of the buffer layer 160 may be substantially equal to, or less or greater than the CTE of the passivation layer 130. Many variations and/or modifications can be made to the CTE of the buffer layer 160.

In some embodiments, the buffer layer 160 is deposited using a compression molding process, an immersion molding process, a screen printing process, a dispensing process, another applicable process, or a combination thereof. In some embodiments, a curing process is subsequently performed to cure the buffer layer 160. In some embodiments, the deposited buffer layer 160 covers the connectors 140 (not shown). A planarization process is subsequently performed over the deposited buffer layer 160 until the connectors 140 are exposed by the buffer layer 160. The planarization process includes a grinding process, a chemical mechanical polishing (CMP) process, an etching process, another applicable process, or a combination thereof. In some other embodiments, the planarization process is not performed over the deposited buffer layer 160.

Figure 1D:
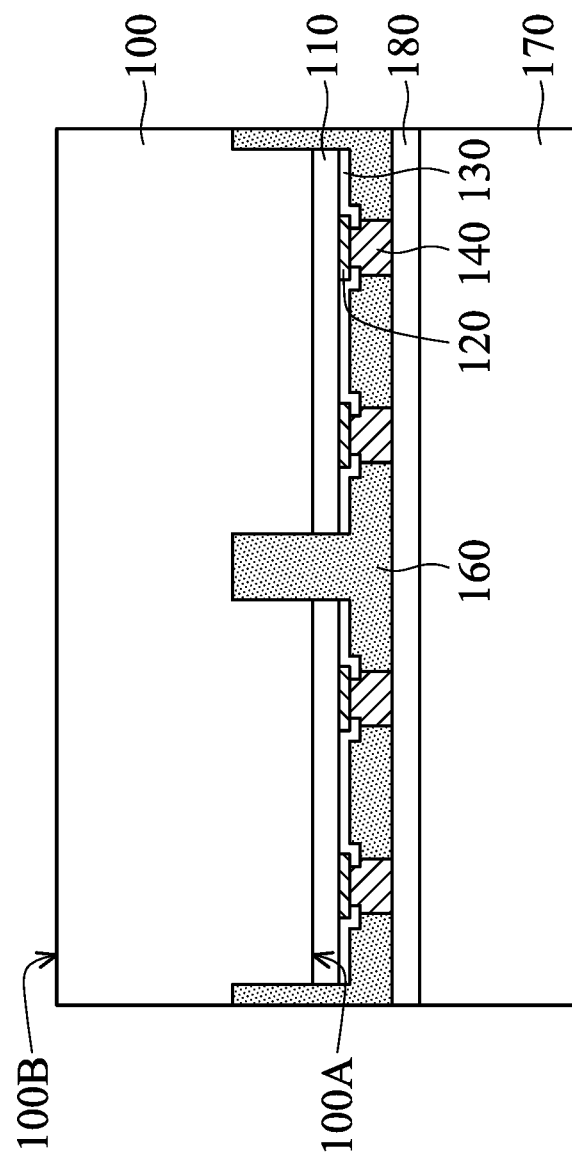

As shown in FIG. 1D, the semiconductor substrate 100 is turned upside down and attached or bonded to a carrier substrate 170 through an adhesive layer 180, in accordance with some embodiments. As a result, the surface 100A of the semiconductor substrate 100 faces the carrier substrate 170.

In some embodiments, the carrier substrate 170 is used as a temporary substrate. The temporary substrate provides mechanical and structural support during a subsequent thinning process, which will be described in more detail later. In some embodiments, the carrier substrate 170 is made of glass material, semiconductor material, ceramic material, polymer material, metal material, another suitable material, or a combination thereof.

In some embodiments, the adhesive layer 180 is used as a temporary adhesive layer. The adhesive layer 180 may be made of glue, or may be a lamination material, such as a foil. In some embodiments, the adhesive layer 180 is photosensitive and is easily detached from the carrier substrate 170 by light irradiation. For example, shining ultra-violet (UV) light or laser light on the carrier substrate 170 is used to detach the adhesive layer 180. In some embodiments, the adhesive layer 180 is a light-to-heat-conversion (LTHC) coating. In some other embodiments, the adhesive layer 180 is heat-sensitive and is easily detached from the carrier substrate 170 when it is exposed to heat.

Figure 1E:
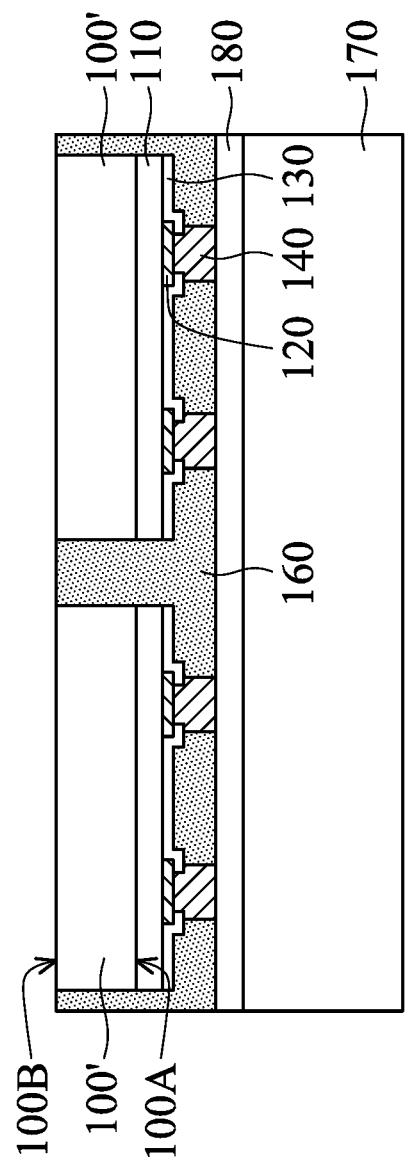

Afterwards, a thinning process is performed over the surface 100B of the semiconductor substrate 100 to thin down the semiconductor substrate 100, in accordance with some embodiments. The thinning process is performed until the buffer layer 160 is exposed. As a result, the semiconductor substrate 100 is separated into multiple semiconductor substrates 100', as shown in FIG. 1E. The semiconductor substrates 100' may be referred to as die substrates. The semiconductor substrates 100' are embedded in the buffer layer 160. A portion of the buffer layer 160 is sandwiched between two of the semiconductor substrates 100'. The buffer layer 160 may or may not be partially removed during the thinning process. In some embodiments, the thinning process includes a grinding process, a CMP process, another applicable process, or a combination thereof.

Figure 1F:
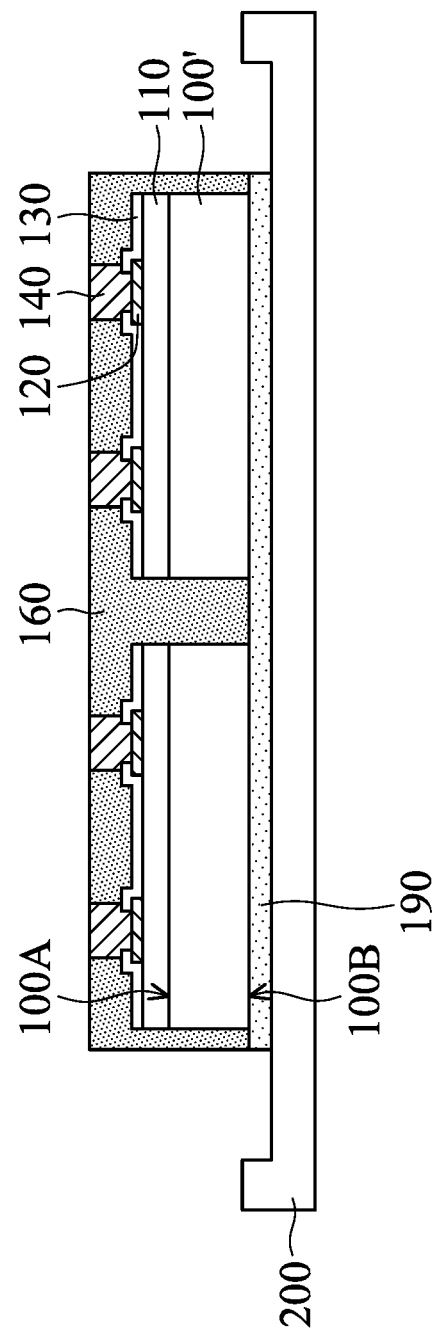

Subsequently, the semiconductor substrates 100' and the buffer layer 160 are flipped and attached or bonded to a substrate 200 through an adhesive layer 190, as shown in FIG. 1F in accordance with some embodiments. The carrier substrate 170 and the adhesive layer 180 are then removed.

The adhesive layer 190 is sandwiched between the surface 100B and the substrate 200. In some embodiments, the adhesive layer 190 is sandwiched between the buffer layer 160 and the substrate 200. In some embodiments, the substrate 200 is a dicing frame or another suitable substrate. In some embodiments, the adhesive layer 190 includes a die attach film (DAF), another suitable adhesive material, or a combination thereof.

Figure 1G:
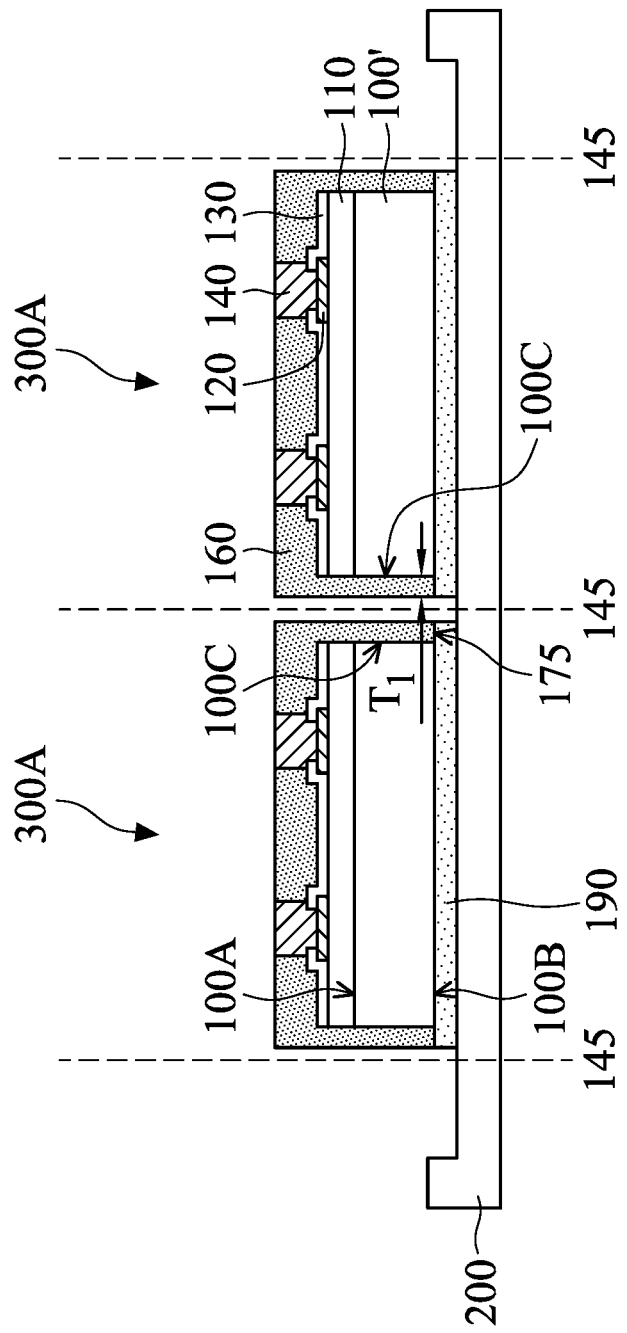

Afterwards, a singulation process is performed over the substrate 200 to form multiple semiconductor dies 300A, as shown in FIG. 1G in accordance with some embodiments. In some embodiments, the singulation process includes a dicing process or another applicable process. For example, the buffer layer 160 and the adhesive layer 190 are sawed or cut along the scribe lines 145 using a blade or laser. As a result, separated semiconductor dies 300A are formed and then picked up from the substrate 200.

In some embodiments, the semiconductor dies 300A are logic dies, central processing unit (CPU) dies, memory dies, sensor dies, or other suitable dies. Each of the semiconductor dies 300A includes the semiconductor substrates 100', the dielectric layer 110, the conductive pads 120, the passivation layer 130, the connectors 140, the buffer layer 160 and the adhesive layer 190, in accordance with some embodiments.

The adhesive layer 190 covers the surface 100B of the semiconductor dies 300A and laterally protrudes from sidewalls 100C of the semiconductor substrates 100'. The buffer layer 160 covers the passivation layer 130 over the surface 100A and extends to adjoin the sidewalls 100C. As a result, the sidewalls 100C are surrounded by the buffer layer 160. The buffer layer 160 overlies a portion of the adhesive layer 190 extending outwardly from the sidewalls 100C of the semiconductor substrates 100'.

In some embodiments, the buffer layer 160 extends along the sidewalls 100C to be in direct contact with the adhesive layer 190 covering the surface 100B. In some embodiments, there is an interface 175 between the buffer layer 160 and the adhesive layer 190. The interface 175 is substantially coplanar with the surface 100B of the semiconductor dies 300A. The buffer layer 160 and the adhesive layer 190 together clad or wrap boundaries, such as corners and edges, of the semiconductor dies 300A. Accordingly, the buffer layer 160 and the adhesive layer 190 provide the semiconductor dies 300A with sufficient protection.

As shown in FIG. 1G, the buffer layer 160 covering the sidewalls 100C of the semiconductor substrates 100' has a thickness $T_1$. In some embodiments, the thickness $T_1$ is in a range from about 10 μm to about 50 μm. For example, the thickness $T_1$ may be in a range from about 10 μm to about 30 μm. However, embodiments of the disclosure are not limited thereto. In some other embodiments, the thickness $T_1$ is in a range from about 3 μm to about 5 μm.

Figure 1H:
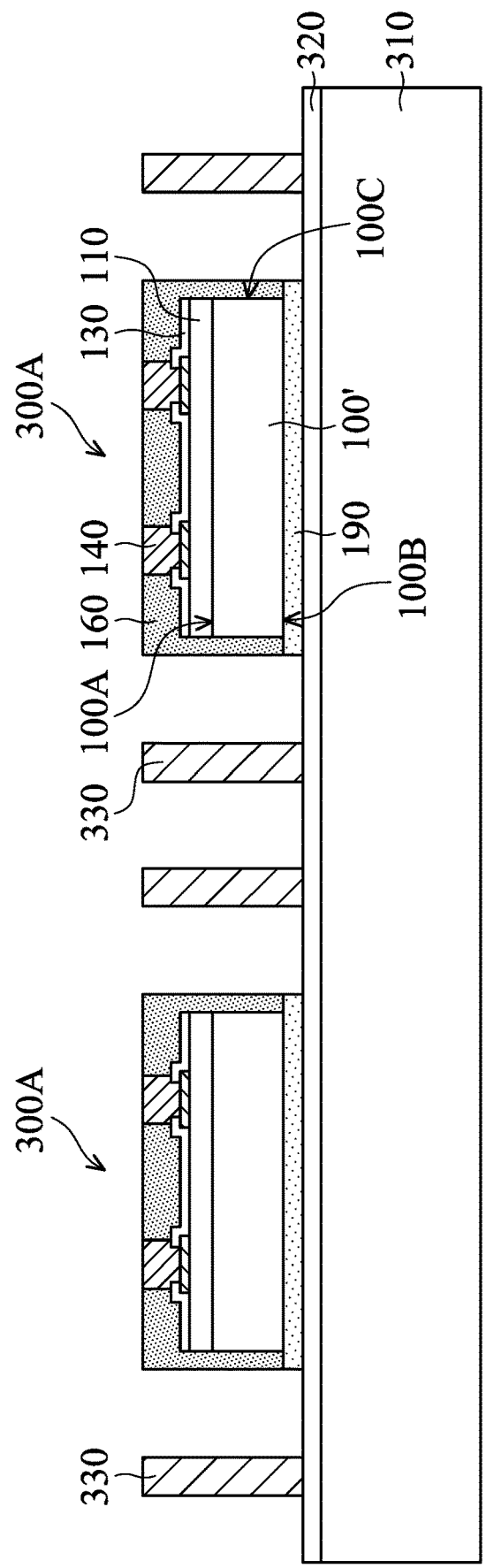

As shown in FIG. 1H, a carrier substrate 310 is provided, in accordance with some embodiments. In some embodiments, the carrier substrate 310 is used as a temporary substrate. The temporary substrate provides mechanical and structural support during subsequent processing steps, such as those described in more detail later. In some embodiments, the carrier substrate 310 is made of glass material, semiconductor material, ceramic material, polymer material, metal material, another suitable material, or a combination thereof. In some embodiments, the carrier substrate 310 is a wafer substrate. In some embodiments, the carrier substrate 310 has a CTE in a range from about 1 ppm/° C. to about 9 ppm/° C. For example, the CTE of the carrier substrate 310 may be in a range from about 5 ppm/° C. to about 7 ppm/° C.

As shown in FIG. 1H, an adhesive layer 320 is deposited over the carrier substrate 310, in accordance with some embodiments. In some embodiments, the adhesive layer 320 is used as a temporary adhesive layer. The adhesive layer 320 may be made of glue, or may be a lamination material, such as a foil. In some embodiments, the adhesive layer 320 is photosensitive and is easily detached from the carrier substrate 310 by light irradiation. For example, shining UV light or laser light on the carrier substrate 310 is used to detach the adhesive layer 320. In some embodiments, the adhesive layer 320 is a LTHC coating. In some other embodiments, the adhesive layer 320 is heat-sensitive and is easily detached from the carrier substrate 310 when it is exposed to heat.

As shown in FIG. 1H, multiple conductive features 330 are formed over the adhesive layer 320, in accordance with some embodiments. In some embodiments, the conductive features 330 are conductive pillars or other suitable features. The conductive features 330 may be referred to as through interposer vias (TIVs). In some embodiments, the conductive features 330 include Cu, Al, Ni, platinum (Pt), another suitable conductive material, or a combination thereof. In some embodiments, the conductive features 330 have a CTE in a range from about 16.8 ppm/° C. to about 17.5 ppm/° C.

In some embodiments, the conductive features 330 are formed using an electroplating process, an electroless plating process, a sputtering process, a physical vapor deposition (PVD) process, a chemical vapor deposition (CVD) process, an electrochemical deposition (ECD) process, a molecular beam epitaxy (MBE) process, an atomic layer deposition (ALD) process, or another applicable process.

For example, a mask layer (not shown) is formed over the adhesive layer 320. The mask layer has openings that define the positions where the conductive features 330 will be formed. A conductive material is deposited to completely or partially fill the openings in the mask layer. The conductive material and the mask layer may be planarized and thinned using a grinding process, a CMP process, an etching process, another applicable process, or a combination thereof. Afterwards, the mask layer is removed, and the deposited conductive material forms the conductive features 330. In some other embodiments, the conductive features 330 are not formed.

Subsequently, the semiconductor dies 300A with the buffer layer 160 are mounted to the carrier substrate 310, as shown in FIG. 1H in accordance with some embodiments. The adhesive layer 190 is attached to the adhesive layer 320 so that the surface 100B faces the carrier substrate 310. Although FIG. 1H shows two semiconductor dies 300A bonded to the carrier substrate 310, embodiments of the disclosure are not limited thereto. In some other embodiments, fewer or more semiconductor dies are bonded to the carrier substrate 310.

Figure 1I:
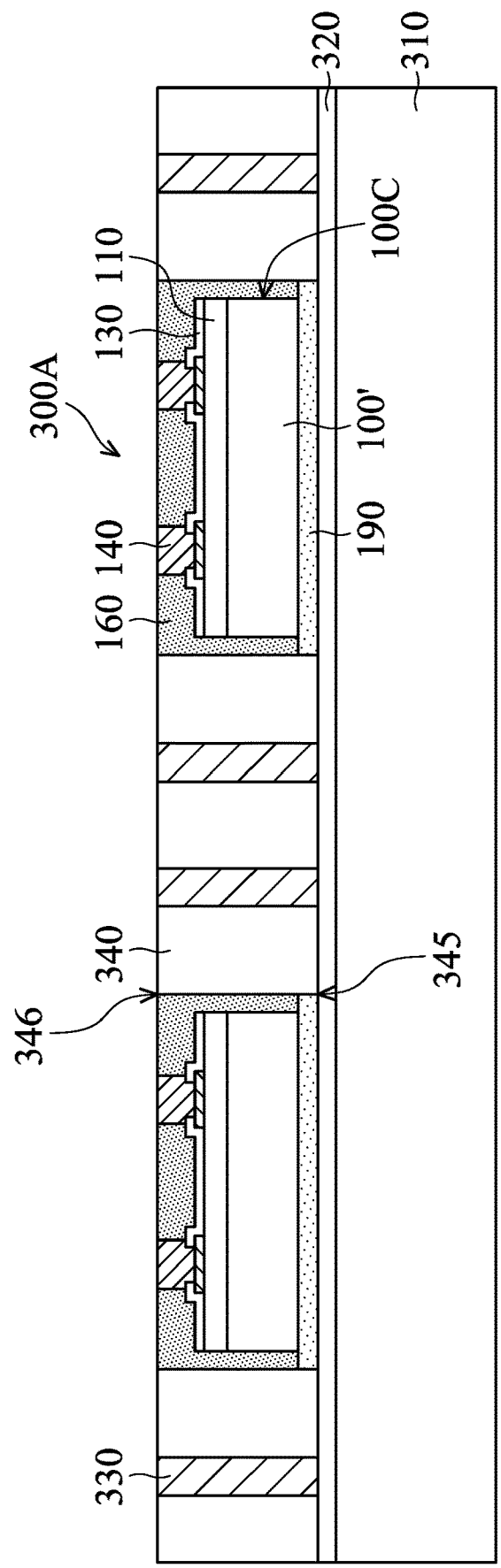

As shown in FIG. 1I, an encapsulation layer (or a package layer) 340 is deposited over the adhesive layer 320, in accordance with some embodiments. As a result, the conductive features 330 and the semiconductor dies 300A are embedded in the encapsulation layer 340. The top surfaces of the conductive features 330 and the semiconductor dies 300A are exposed by the encapsulation layer 340. For example, the connectors 140 and the buffer layer 160 are exposed by the encapsulation layer 340.

In some embodiments, the encapsulation layer 340, the buffer layer 160 and the adhesive layer 190 adjoin each other. In some embodiments, there is an interface 345 between the encapsulation layer 340 and the adhesive layer 190. In some embodiments, there is an interface 346 between the encapsulation layer 340 and the buffer layer 160. The interface 345 and the interface 346 can be observed using an electron microscope. In some embodiments, the interface 345 is substantially coplanar with the interface 346.

In some embodiments, the encapsulation layer 340 includes a polymer material. For example, the encapsulation layer 340 includes a molding compound, Ajinomoto Buildup Film (ABF), or another suitable encapsulation material. The encapsulation layer 340 may contain fillers dispersed therein. The fillers may include insulating fibers, insulating particles, other suitable elements, or a combination thereof. In some embodiments, the encapsulation layer 340 and the buffer layer 160 include different materials. However, embodiments of the disclosure are not limited thereto. In some other embodiments, the encapsulation layer 340 and the buffer layer 160 include substantially the same material. For example, the encapsulation layer 340 and the buffer layer 160 include a molding compound. The material, size and/or concentration of fillers dispersed in the encapsulation layer 340 and the buffer layer 160 may or may not be the same.

In some embodiments, the encapsulation layer 340 is deposited using a molding process. In some embodiments, a liquid molding compound material is applied over the adhesive layer 320. In some embodiments, a thermal process is then performed to cure and harden the molding compound material and to transform it into the encapsulation layer 340. As a result, the conductive features 330 and the semiconductor dies 300A are surrounded and encapsulated by the deposited encapsulation layer 340.

In some embodiments, the deposited encapsulation layer 340 does not cover the top surfaces of the conductive features 330 and the semiconductor dies 300A. However, embodiments of the disclosure are not limited thereto. In some other embodiments, the deposited encapsulation layer 340 covers the top surfaces of the conductive features 330 and the semiconductor dies 300A. Afterwards, the deposited encapsulation layer 340 is thinned to expose the conductive features 330 and the semiconductor dies 300A. A planarization process may be used to thin the deposited encapsulation layer 340. The planarization process includes a grinding process, a CMP process, an etching process, another applicable process, or a combination thereof.

In some embodiments, the encapsulation layer 340 has a CTE in a range from about 15 ppm/° C. to about 50 ppm/° C., but embodiments of the disclosure are not limited thereto. In some embodiments, the CTE of the buffer layer 160 is less than the CTE of the encapsulation layer 340 and is greater than the CTE of the semiconductor substrates 100'. In some embodiments, the CTE of the buffer layer 160 is less than the CTE of the encapsulation layer 340 and is greater than the CTE of the carrier substrate 310. In some embodiments, the CTE of the semiconductor substrates 100' is different from the CTE of the carrier substrate 310. For example, the CTE of the semiconductor substrates 100' may be less than the CTE of the carrier substrate 310.

In some cases, CTE mismatch between heterogeneous materials in a package structure may result in strain and stress concentration and thus cause damage during and after the fabrication processes. For example, a semiconductor die and an encapsulation layer are over a carrier substrate, and the semiconductor die is surrounded by the encapsulation layer. Due to CTE mismatch, delamination may be induced between any two of the semiconductor die, the encapsulation layer, and the carrier substrate. Damage to the package structure may also include cracking at the corners and/or edges of a semiconductor die, and other defects.

According to some embodiments of the disclosure, the buffer layer 160 is configured to be sandwiched between the encapsulation layer 340 and the semiconductor substrates 100' over the carrier substrate 310. Strain/stress, which would be caused by CTE mismatch between any two of the encapsulation layer 340, the semiconductor dies 300A and the carrier substrate 310, is absorbed and relieved by the buffer layer 160. As a result, damage to the package structure, which may result from a non-uniform distribution of strain/stress, is greatly mitigated or eliminated.

The material of the buffer layer 160 can be selected to minimize CTE differences in the package structure, such as CTE differences between the buffer layer 160 and any one of the encapsulation layer 340, the semiconductor dies 300A and the carrier substrate 310. Many variations and/or modifications can be made to embodiments of the disclosure. The CTE of the buffer layer 160 is not limited to being less than the CTE of the encapsulation layer 340 and greater than the CTE of the semiconductor substrates 100' or the carrier substrate 310. In some other embodiments, the CTE of the buffer layer 160 is substantially equal to or greater than the CTE of the encapsulation layer 340. In some other embodiments, the CTE of the buffer layer 160 is substantially equal to or less than the CTE of the semiconductor substrates 100' or the carrier substrate 310.

The encapsulation layer 340 may inevitably shrink due to heat applied during the fabrication processes. For example, the encapsulation layer 340 may shrink during the thermal process for curing the material of the encapsulation layer 340. The encapsulation layer 340 may further shrink during subsequent multiple processing steps, such as those described in more detail later. The encapsulation layer 340 may shrink due to aging as well. In some embodiments, the encapsulation layer 340 has a shrinkage rate in a range from about 0.1% to about 0.3%. It should be noted that the shrinkage rate of the encapsulation layer 340 is only an example and is not a limitation to the disclosure.

Compared to the semiconductor substrates 100' and/or the carrier substrate 310, the encapsulation layer 340 is softer and more elastic. In some embodiments, the shrinkage rate of the encapsulation layer 340 is greater than the shrinkage rate of the semiconductor substrates 100' and/or the carrier substrate 310. The semiconductor substrates 100' and/or the carrier substrate 310 may not shrink during the fabrication processes.

In some cases, shrinkage may induce strain and stress in a package structure and thus cause damage during and after the fabrication processes. For example, damage to a package structure may include delamination between any two of an encapsulation layer, a semiconductor die and a carrier substrate, cracking at the corners and/or edges of a semiconductor die, and other defects. When a package structure includes a thin semiconductor die or multiple semiconductor dies, damage as a result of shrinkage may become more severe than that as a result of CTE mismatch between heterogeneous materials. For example, a thin semiconductor die has a thickness that is not greater than about 100 μm.

According to some embodiments of the disclosure, the buffer layer 160 can balance or offset strain/stress in the package structure. As a result, damage to the package structure, which would be caused by shrinkage of the encapsulation layer 340 or other thermoplastic materials, is significantly mitigated or eliminated.

In accordance with some embodiments, the buffer layer 160 protects the package structure from defects, which may be induced by shrinkage of plastic materials and CTE mismatch between heterogeneous materials. Therefore, the package structure, in particular to which includes a thin semiconductor die or multiple semiconductor dies, has enhanced reliability.

Figure 1J:
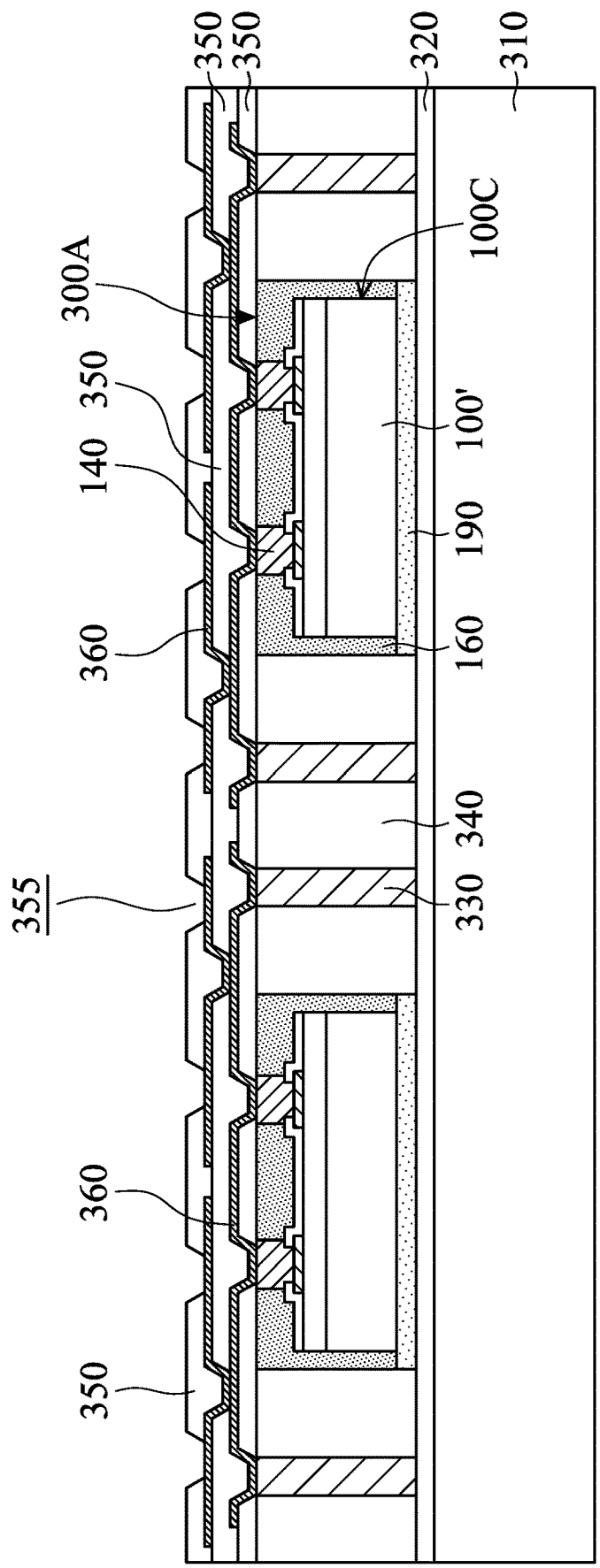

Subsequently, a redistribution structure is formed over the encapsulation layer 340 and the semiconductor dies 300A, in accordance with some embodiments. The redistribution structure includes one or more passivation layers and one or more conductive layers. For example, the redistribution structure includes passivation layers 350 and conductive layers 360, as shown in FIG. 1J in accordance with some embodiments. The conductive layers 360 may be referred to as redistribution layers (RDLs).

The passivation layers 350 cover the encapsulation layer 340, the conductive features 330 and the semiconductor dies 300A. In some embodiments, the adhesive layer 190 and the bottommost layer of the passivation layers 350 sandwich the buffer layer 160. The bottommost layer of the passivation layers 350 has openings (not shown) exposing the conductive features 330 and the connectors 140. The conductive layers 360 are electrically connected to the conductive features 330 and the connectors 140 through the openings of the bottommost layer of the passivation layers 350. The topmost layer of the passivation layers 350 has openings 355 partially exposing the topmost layer of the conductive layers 360. The openings 355 provide further electrical connection paths, which will be described in more detail later.

In some embodiments, the passivation layers 350 are made of a photosensitive material, such as a photoresist material. In some embodiments, the passivation layers 350 are made of PBO, PI, BCB, silicone, acrylates, siloxane, another suitable material, or a combination thereof. In some other embodiments, the passivation layers 350 are made of non-organic materials. The non-organic materials include silicon oxide, un-doped silicate glass, silicon oxynitride, solder resist (SR), silicon nitride, silicon carbide, hexamethyldisilazane (HMDS), another suitable material, or a combination thereof.

In some embodiments, the passivation layers 350 are deposited using a spray coating process, a spin-on process, a CVD process, an ALD process, a PVD process, another applicable process, or a combination thereof. In some embodiments, the passivation layers 350 are photopatternable, and the openings 355 in the passivation layers 350 are formed using a photolithography process including exposure and developing stages. However, embodiments of the disclosure are not limited thereto. In some other embodiments, the openings 350 in the passivation layers 350 are formed using photolithography and etching processes.

In some embodiments, the conductive layers 360 are made of a metal material. Examples of the metal material include Cu, Al, W, titanium (Ti), tantalum (Ta), another suitable material, or a combination thereof. In some embodiments, the conductive layers 360 are formed by an electroplating process, an electroless plating process, a sputtering process, a CVD process, or another applicable process.

In some embodiments, the passivation layers 350 have a CTE in a range from about 15 ppm/° C. to about 50 ppm/° C., but embodiments of the disclosure are not limited thereto. The passivation layers 350 may shrink due to heat applied during the fabrication processes. According to some embodiments of the disclosure, the buffer layer 160 diminishes strain/stress, which would be caused by CTE mismatch between heterogeneous materials in the package structure and shrinkage of the passivation layers 350. As a result, the passivation layers 350 and the conductive layers 360 are prevented from severe bending, deformation and displacement.

Figure 1K:
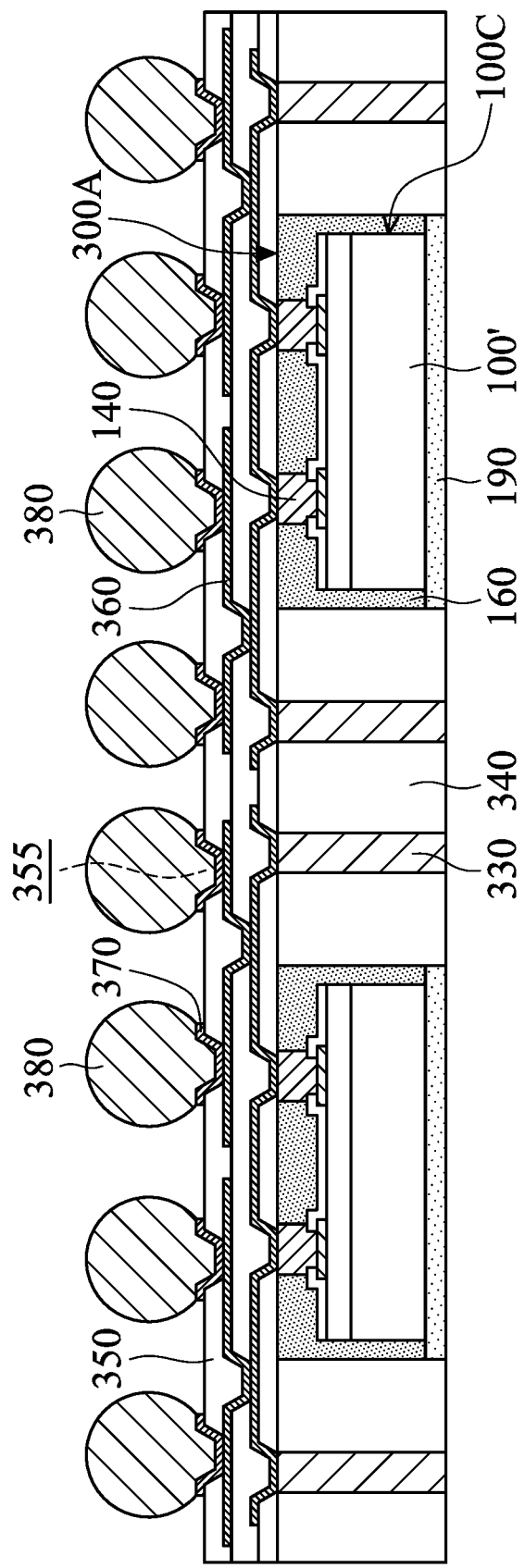

As shown in FIG. 1K, under bump metallization (UBM) features 370 are formed in the openings 355, in accordance with some embodiments. The UBM features 370 are electrically connected to the exposed conductive layer 360. In some embodiments, the UBM features 370 include a diffusion barrier layer (or an adhesion layer) over the conductive layer 360 and a seed layer over the diffusion barrier layer. For example, the diffusion barrier layer may be made of tantalum nitride, titanium nitride, tantalum, titanium, another suitable diffusion barrier material, or a combination thereof. The seed layer may be made of copper, chromium, nickel, tin, gold, another suitable seed material, or a combination thereof.

As shown in FIG. 1K, multiple connectors 380 are formed over the UBM features 370, in accordance with some embodiments. In some embodiments, the connectors 380 are electrically connected to the conductive layer 360 through the UBM features 370 in the openings 355. The connectors 380 include solder bumps (or solder balls), metal pillars, other suitable connectors, or a combination thereof. In some embodiments, the connectors 380 include solder, copper, or another suitable conductive material.

Afterwards, the carrier substrate 310 and the adhesive layer 320 are removed. Suitable light may be provided to remove the adhesive layer 320 so as to lift off the carrier substrate 310 as well. In some embodiments, after the removal of the carrier substrate 310, the buffer layer 160 maintains good balance of strain/stress in the structure shown in FIG. 1K.

Subsequently, one or more device elements (not shown) may be bonded to the structure shown in FIG. 1K. The device elements are electrically connected to the conductive features 330. For example, the device elements may be a dynamic random access memory (DRAM) die or other suitable dies. A reflow process may be performed to bond the device elements to the structure shown in FIG. 1K. The encapsulation layer 340 and/or the passivation layers 350 may shrink, as mentioned above, during the reflow process but the buffer layer 160 mitigates or eliminates damage to the package structure induced by shrinkage.

Afterwards, a singulation process is performed to form multiple package on package (PoP) structures. Each of the package structures includes one semiconductor die 300A or multiple semiconductor dies 300A. Many variations and/or modifications can be made to embodiments of the disclosure. For example, although the embodiments described in FIGS. 1A-1K relates to a fan-out PoP structure, embodiments of the disclosure are not limited thereto. In some other embodiments, no device element is bonded to the structure shown in FIG. 1K and the conductive features 330 are not formed. A singulation process is subsequently performed to separate this structure into multiple package structures including one semiconductor die 300A or multiple semiconductor dies 300A.

Embodiments of the disclosure can be applied to fabrication processes for any suitable package structure including one or more semiconductor dies surrounded by an encapsulation layer. It should be noted that the described CTE of features in the package structure is only an example and is not a limitation to the disclosure.

Many variations and/or modifications can be made to embodiments of the disclosure. For example, FIGS. 1C-1E show that after the deposition of the buffer layer 160, a thinning process is performed over the surface 100B of the semiconductor substrate 100 until the semiconductor substrate 100 is separated into multiple semiconductor substrates 100'. However, embodiments of the disclosure are not limited thereto. The buffer layer 160 may be deposited after the semiconductor substrate 100 is separated into multiple semiconductor substrates 100'.

Figure 2A:
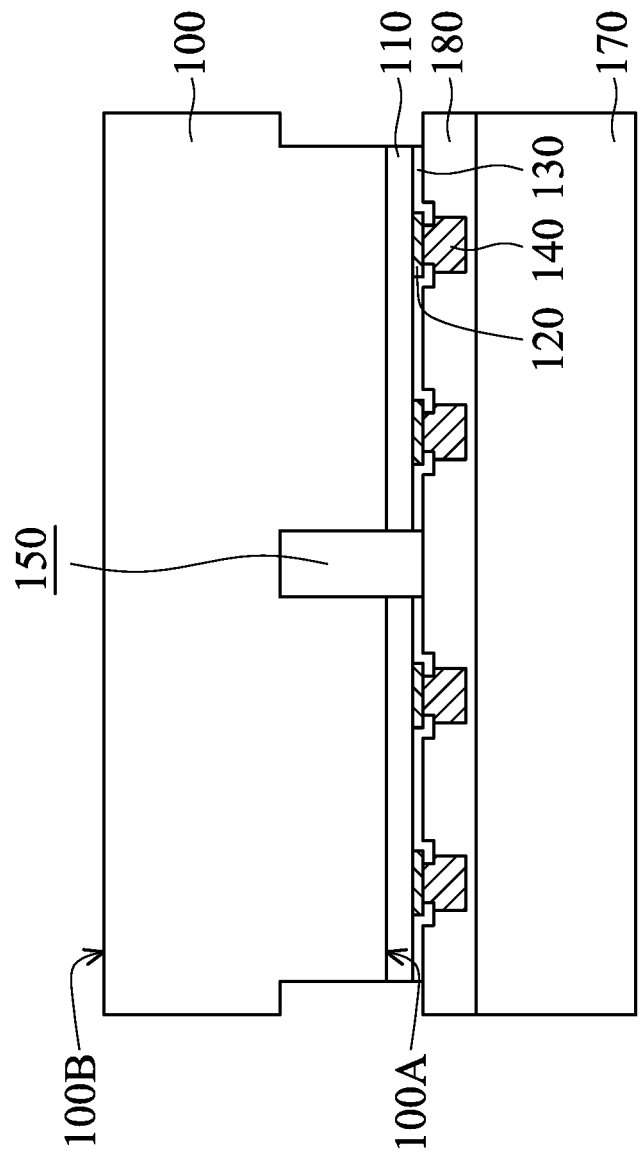
FIGS. 2A-2C are cross-sectional views of various stages of a process for forming a package structure, in accordance with some embodiments.
Figure 2B:
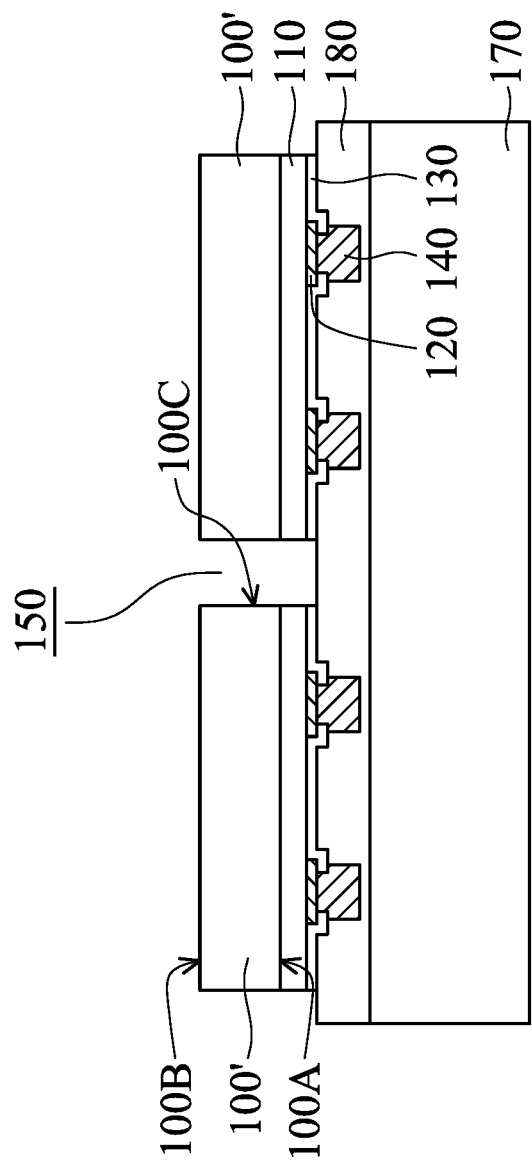
Figure 2C:
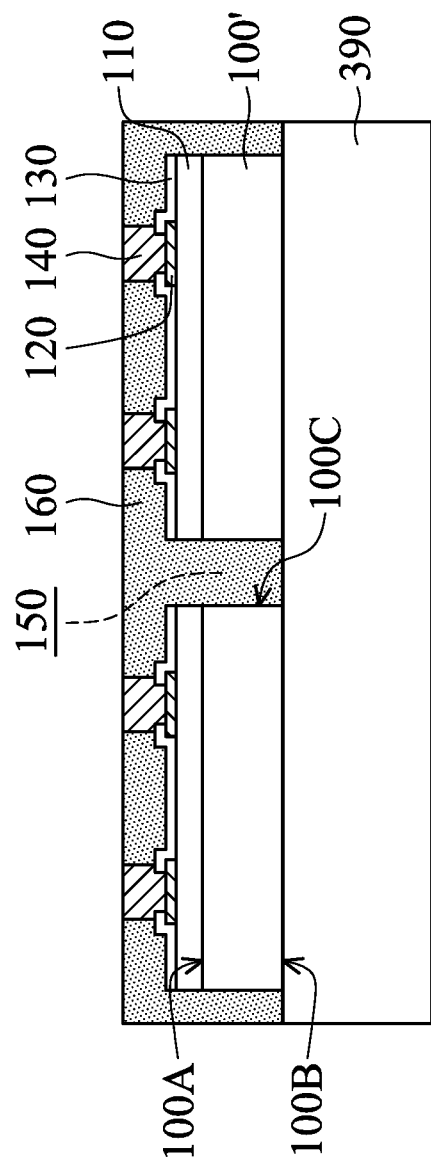

FIGS. 2A-2C are cross-sectional views of various stages of a process for forming a package structure, in accordance with some embodiments. The materials and/or formation methods of the structure shown in FIGS. 2A-2C are the same as or similar to those of the structure shown in FIGS. 1A-1K, as illustrated in the aforementioned embodiments, and are not repeated.

As shown in FIG. 2A, the structure shown in FIG. 1B is turned upside down and bonded to the carrier substrate 170 through the adhesive layer 180, in accordance with some embodiments. As a result, the surface 100A of the semiconductor substrate 100 faces the carrier substrate 170. In some embodiments, the connectors 140 sink in the adhesive layer 180. It should be noted that the structure shown in FIG. 2A is only an example and is not a limitation to the disclosure. The adhesive layer 180 may fill the trenches 150 so as to provide stronger support during a subsequent thinning process.

Afterwards, a thinning process is performed over the surface 100B of the semiconductor substrate 100 to thin down the semiconductor substrate 100 until the trenches 150 (or the adhesive layer 180 filled in the trenches 150) are exposed. As a result, the semiconductor substrate 100 is separated into multiple semiconductor substrates 100', as shown in FIG. 2B.

Subsequently, the semiconductor substrates 100' are flipped and placed on a substrate 390, as shown in FIG. 2C in accordance with some embodiments. The carrier substrate 170 and the adhesive layer 180 are then removed. As shown in FIG. 2C, the buffer layer 160 is deposited over the substrate 390, in accordance with some embodiments. The buffer layer 160 fills up the trenches 150 between the semiconductor substrates 100'. As a result, the connectors 140, the passivation layer 130, the dielectric layer 110 and the semiconductor substrate 100 are surrounded by the buffer layer 160.

Afterwards, the substrate 390 is removed. The semiconductor substrates 100' and the buffer layer 160 are attached or bonded to the substrate 200 through the adhesive layer 190, as shown in FIG. 1F. The steps described in FIGS. 1G-1K are performed sequentially to continue the fabrication of the package structure, as shown in FIG. 1K.

Many variations and/or modifications can be made to embodiments of the disclosure. For example, additional operations can be provided after the stage described in FIG. 1B and before the stage described in FIG. 1C. FIGS. 3A-3E are cross-sectional views of various stages of a process for forming a package structure, in accordance with some embodiments. The materials and/or formation methods of the structure shown in FIGS. 3A-3E are the same as or similar to those of the structure shown in FIGS. 1A-1K, as illustrated in the aforementioned embodiments, and are not repeated.

Figure 3A:
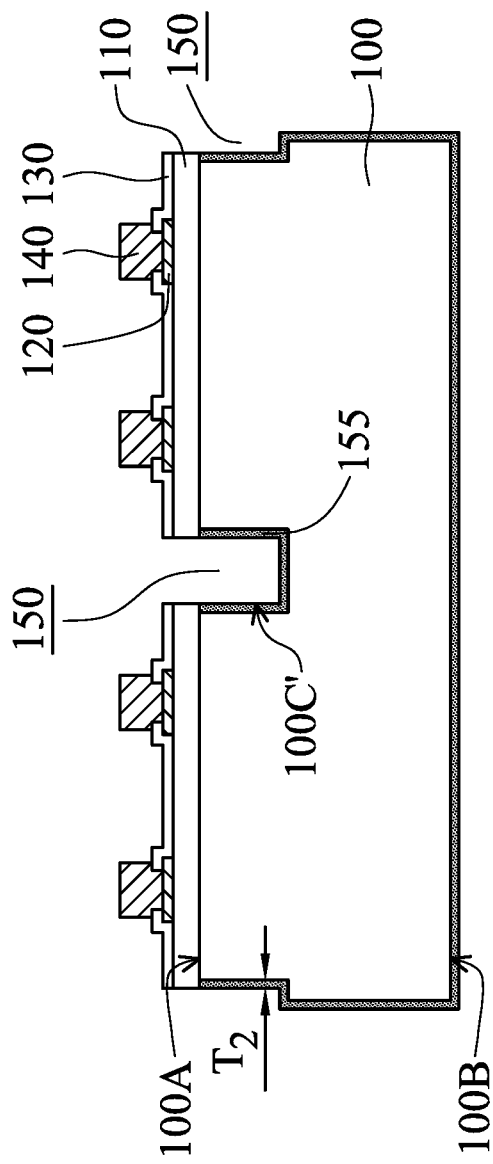
FIGS. 3A-3E are cross-sectional views of various stages of a process for forming a package structure, in accordance with some embodiments.

The structure shown in FIG. 1B is provided, and then a surface treatment is performed. In some embodiments, the surface treatment is a thermal oxidation process, another applicable process, or a combination thereof. The exposed surfaces of the semiconductor substrate 100 may be oxidized by hydrogen peroxide, another suitable oxidant, or a combination thereof. As a result, a buffer layer 155 is formed at the exposed surfaces of the semiconductor substrate 100, as shown in FIG. 3A. The buffer layer 155 can improve adhesion between the semiconductor substrate 100 and the subsequently deposited buffer layer 160. Accordingly, there is substantially no delamination between the semiconductor substrate 100 and the subsequently deposited buffer layer 160.

The exposed surfaces of the semiconductor substrate 100 include the surface 100B and other surfaces 100C' of the semiconductor substrate 100 exposed through the trenches 150, as shown in FIG. 3A. The surface 100A of the semiconductor substrate 100 is covered by the dielectric layer 110 and the passivation layer 130. Accordingly, the semiconductor substrate 100 is partially surrounded by the buffer layer 155.

Figure 3B:
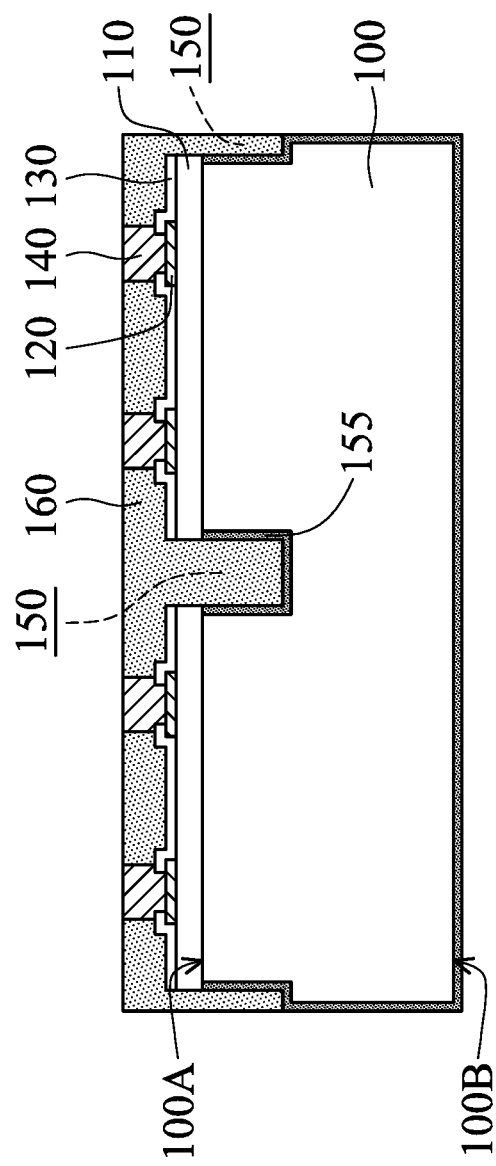

After the surface treatment, the buffer layer 160 is deposited over the passivation layer 130 and fills up the trenches 150, as shown in FIG. 3B in accordance with some embodiments. In some embodiments, the buffer layer 160 is separated from the semiconductor substrate 100 by the buffer layer 155. In some embodiments, the interface between the buffer layer 155 and the buffer layer 160 is substantially coplanar with the interface between the passivation layer 130 and the buffer layer 160. In some embodiments, the buffer layer 160 is thicker than the buffer layer 155.

Figure 3C:
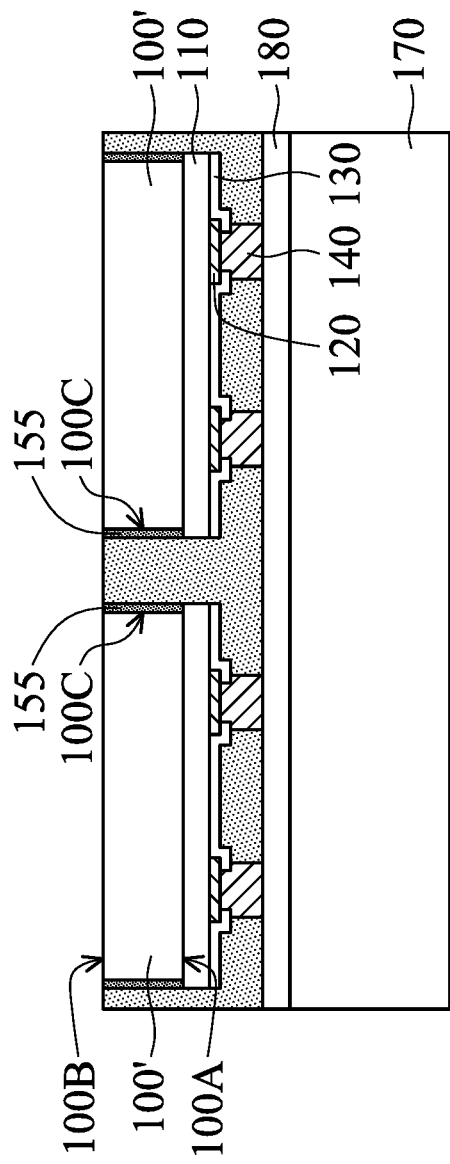

Afterwards, the structure shown in FIG. 3B is turned upside down and bonded to the carrier substrate 170 through the adhesive layer 180. As shown in FIG. 3C, a thinning process is performed over the surface 100B of the semiconductor substrate 100 to thin down the semiconductor substrate 100 until the buffer layer 160 is exposed. As a result, the semiconductor substrate 100 is separated into multiple semiconductor substrates 100'. In some embodiments, the buffer layer 155 is partially removed during the thinning process. The buffer layer 155 remains on the sidewalls 100C of the semiconductor substrates 100'. In some embodiments, the buffer layer 155 is sandwiched between the buffer layer 160 and the sidewalls 100C of the semiconductor substrates 100'.

Figure 3D:
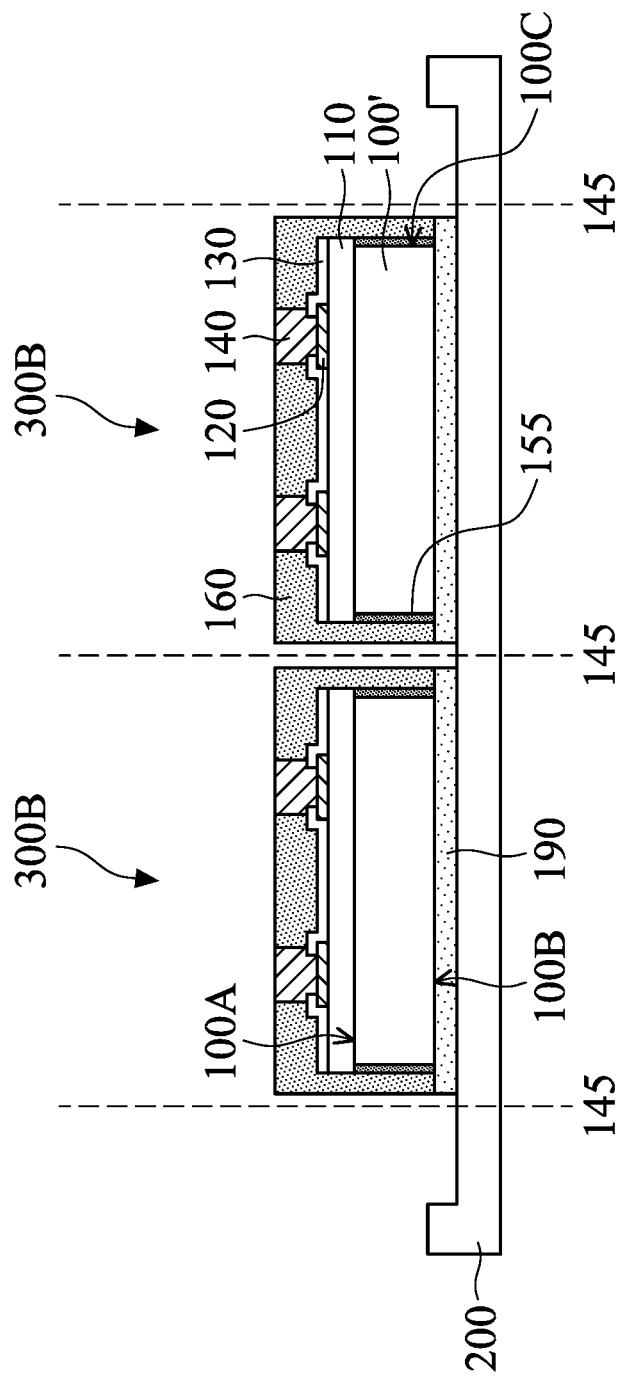

Subsequently, the semiconductor substrates 100' and the buffer layer 160 are flipped and attached to the substrate 200 through the adhesive layer 190, as shown in FIG. 3D in accordance with some embodiments. The carrier substrate 170 and the adhesive layer 180 are then removed. Afterwards, a singulation process is performed over the substrate 200 to form multiple semiconductor dies 300B, as shown in FIG. 3D in accordance with some embodiments. Each of the semiconductor dies 300B includes the semiconductor substrates 100', the dielectric layer 110, the conductive pads 120, the passivation layer 130, the connectors 140, the buffer layer 155, the buffer layer 160 and the adhesive layer 190.

Figure 3E:
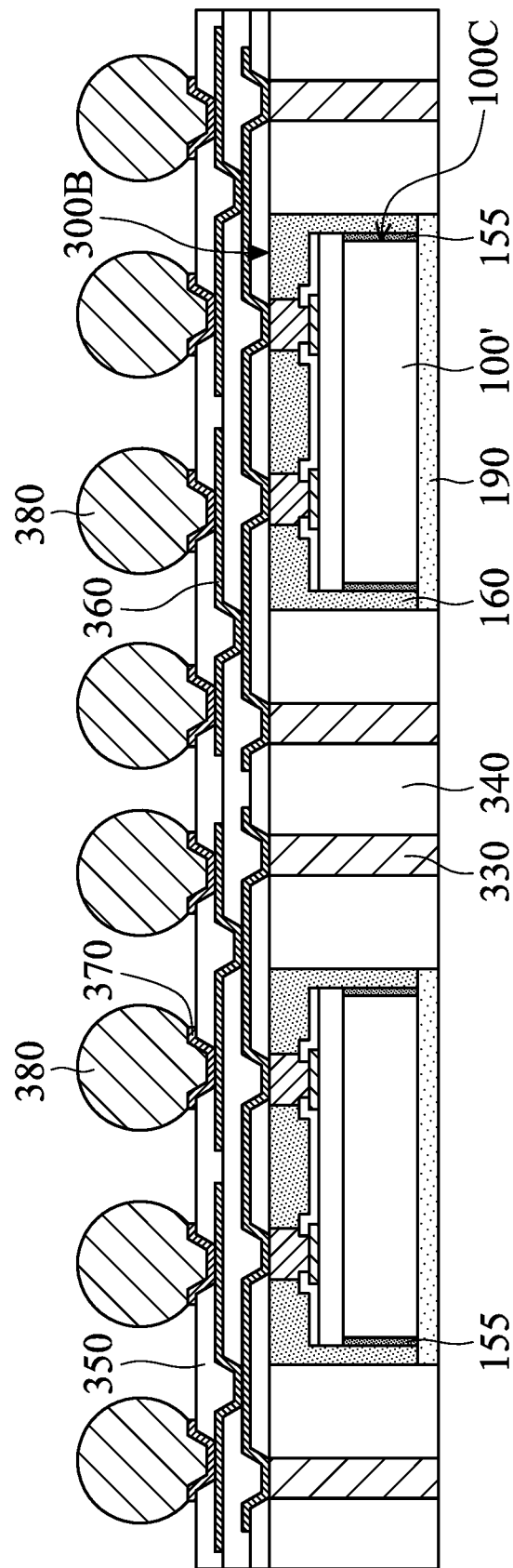

The steps described in FIGS. 1H-1K are performed sequentially to continue the fabrication of the package structure, as shown in FIG. 3E. In other words, the semiconductor dies 300A of the package structure described in FIG. 1K can be replaced with the semiconductor dies 300B so as to form the package structure shown in FIG. 3E. The structure and/or formation methods of the package structure shown in FIG. 3E are similar to those of the package structure shown in FIG. 1K, as illustrated in the aforementioned embodiments, and are not repeated.

Many variations and/or modifications can be made to embodiments of the disclosure. For example, although FIG. 1K shows that the buffer layer 160 adjoins the sidewall 100C of the semiconductor substrates 100', embodiments of the disclosure are not limited thereto. Additional features, such as one or more additional buffer layers, may be added between the buffer layer 160 and the sidewall 100C of the semiconductor substrates 100'.

Figure 4A:
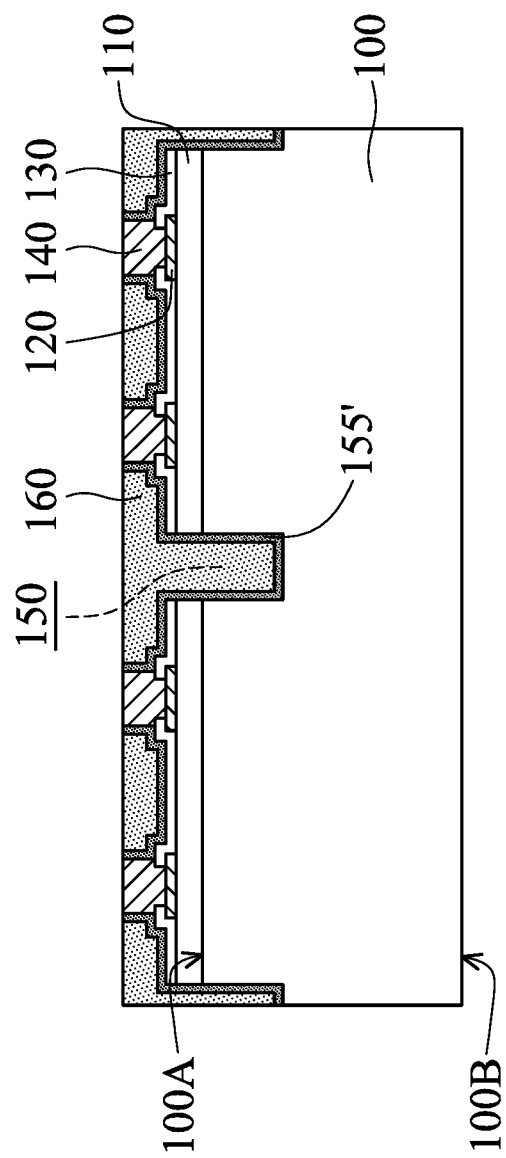
FIGS. 4A-4B are cross-sectional views of various stages of a process for forming a package structure, in accordance with some embodiments.
Figure 4B:
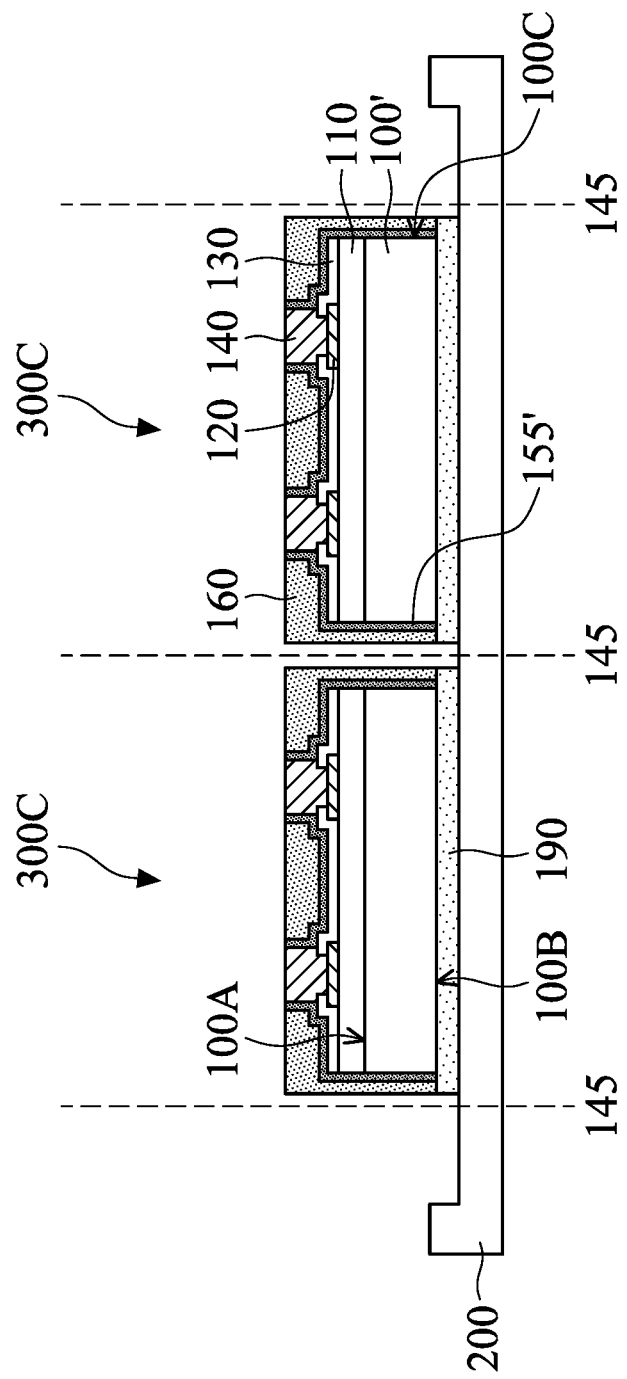

FIGS. 4A and 4B are cross-sectional views of various stages of a process for forming a package structure, in accordance with some embodiments. The materials and/or formation methods of the structure shown in FIGS. 4A and 4B are the same as or similar to those of the structure shown in FIGS. 1A-1K, as illustrated in the aforementioned embodiments, and are not repeated.

The structure shown in FIG. 1B is provided. A buffer layer 155' is then deposited, as shown in FIG. 4A in accordance with some embodiments. The buffer layer 155' can improve adhesion between the semiconductor substrate 100 and the subsequently deposited buffer layer 160. In some embodiments, the buffer layer 155' is deposited conformally without filling up the trenches 150. The buffer layer 155' covers the semiconductor substrate 100, the dielectric layer 110, the passivation layer 130, and the connectors 140.

In some embodiments, the buffer layer 155' is made of oxide (such as silicon oxide), spin-on glass (SOG), or another suitable dielectric material. In some embodiments, the buffer layer 155' is deposited using a spray coating process, a spin-on process, a dispensing process, a CVD process, an ALD process, another applicable process, or a combination thereof. For example, the CVD process may include an electron cyclotron resonance-plasma enhanced CVD (ECR-PECVD) process or another suitable CVD process.

As shown in FIG. 4A, the buffer layer 160 is deposited over the buffer layer 155' and fills up the trenches 150, in accordance with some embodiments. The buffer layer 160 is separated from the semiconductor substrate 100, the dielectric layer 110, the passivation layer 130, and the connectors 140 by the buffer layer 155'. In some embodiments, the buffer layer 160 is thicker than the buffer layer 155'.

In some embodiments, the deposited buffer layer 155' and the deposited buffer layer 160 cover the connectors 140 (not shown). A planarization process is subsequently performed over the deposited buffer layer 155' and the deposited buffer layer 160 until the connectors 140 are exposed. The planarization process includes a grinding process, a CMP process, an etching process, another applicable process, or a combination thereof. In some other embodiments, the planarization process is not performed over the deposited buffer layer 155' and the deposited buffer layer 160.

Afterwards, the steps described in FIGS. 1D-1G are performed sequentially. As a result, multiple semiconductor dies 300C are formed, as shown in FIG. 4B. Each of the semiconductor dies 300C includes the semiconductor substrates 100', the dielectric layer 110, the conductive pads 120, the passivation layer 130, the connectors 140, the buffer layer 155', the buffer layer 160 and the adhesive layer 190. The steps described in FIGS. 1H-1K are performed sequentially to continue the fabrication of the package structure (not shown). In other words, the semiconductor dies 300A of the package structure described in FIG. 1K can be replaced with the semiconductor dies 300C so as to form another package structure.

Many variations and/or modifications can be made to embodiments of the disclosure. For example, FIGS. 4A and 4B show that after the deposition of the buffer layer 155' and the buffer layer 160, the semiconductor substrate 100 is separated into multiple semiconductor substrates 100'. However, embodiments of the disclosure are not limited thereto. The buffer layer 155' and the buffer layer 160 may be deposited after the semiconductor substrate 100 is separated into multiple semiconductor substrates 100'.

Figure 5A:
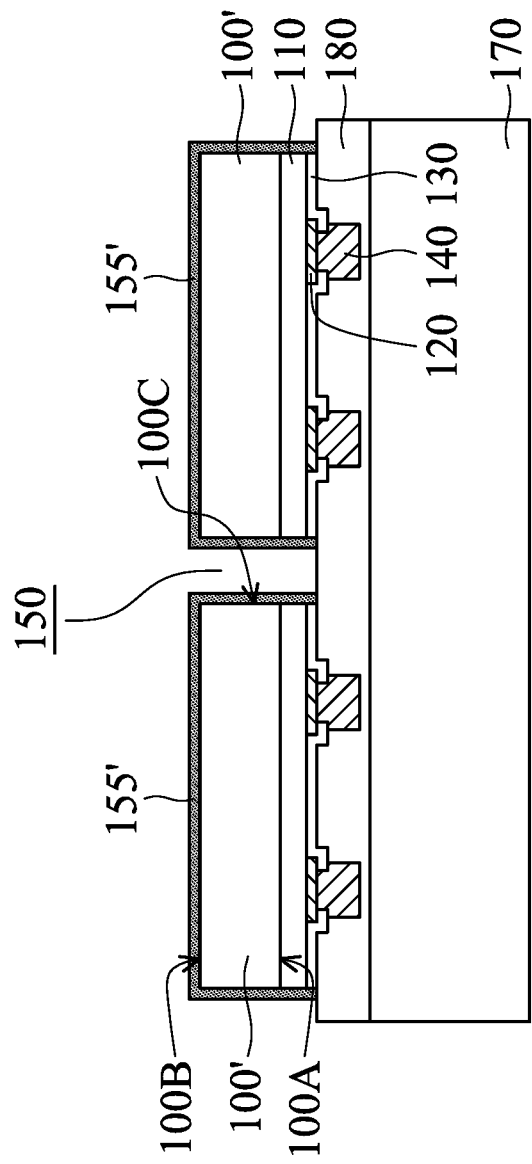
FIGS. 5A-5C are cross-sectional views of various stages of a process for forming a package structure, in accordance with some embodiments.
Figure 5B:
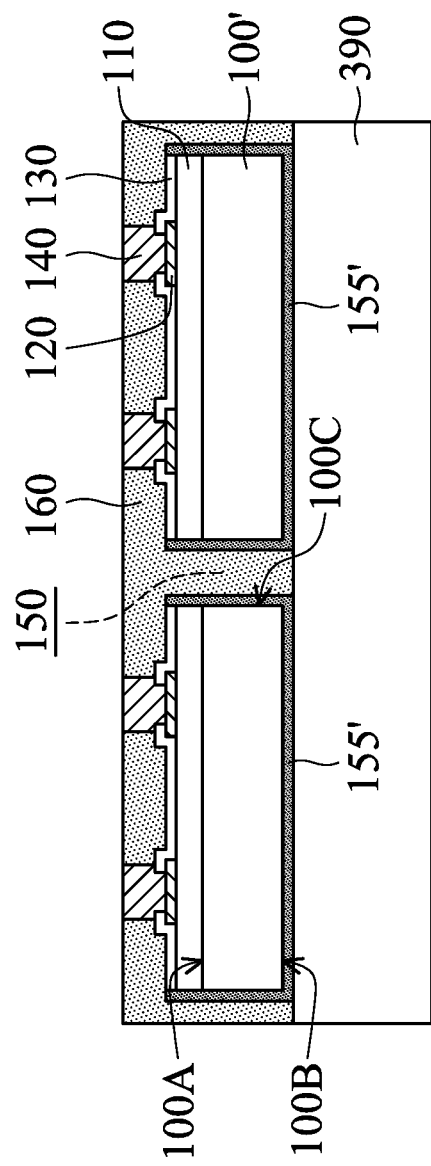
Figure 5C:
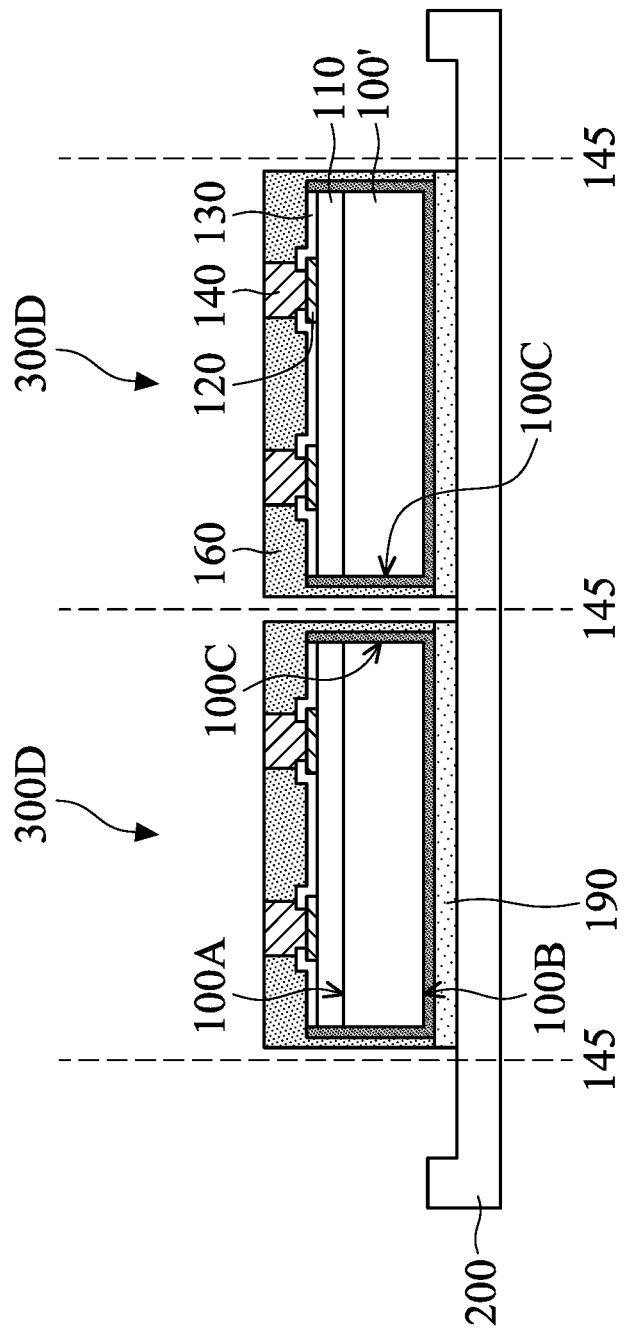

FIGS. 5A-5C are cross-sectional views of various stages of a process for forming a package structure, in accordance with some embodiments. The materials and/or formation methods of the structure shown in FIGS. 5A-5C are the same as or similar to those of the structure shown in FIGS. 1A-1K and 2A-2C, as illustrated in the aforementioned embodiments, and are not repeated.

The structure shown in FIG. 2B is provided. After the semiconductor substrate 100 is thinned and separated into multiple semiconductor substrates 100', the buffer layer 155' is deposited over the semiconductor substrates 100', as shown in FIG. 5A. In some embodiments, the buffer layer 155' is deposited conformally and covers the surface 100B and the sidewalls 100C of the semiconductor substrate 100. The buffer layer 155' further covers sidewalls of the dielectric layer 110 and the passivation layer 130.

In some embodiments, the buffer layer 155' is made of oxide (such as silicon oxide), SOG, or another suitable dielectric material. The buffer layer 155' can improve adhesion between the semiconductor substrates 100' and the subsequently deposited buffer layer 160. In some embodiments, the buffer layer 155' is made of nitride (such as silicon nitride), or another suitable dielectric material. The buffer layer 155' can reduce warping of the semiconductor substrates 100' or balance warping levels. In some embodiments, the buffer layer 155' is deposited using a spray coating process, a spin-on process, a dispensing process, a CVD process, an ALD process, another applicable process, or a combination thereof.

Although FIG. 5A shows that the buffer layer 155' is a single layer, embodiments of the disclosure are not limited thereto. In some other embodiments, the buffer layer 155' is a multi-layer structure (not shown) so as to improve adhesion and reduce warping. For example, the buffer layer 155' may include a nitride sub-layer and an oxide sub-layer covering the nitride sub-layer. Alternatively, the buffer layer 155' may be an oxide/nitride/oxide (ONO) structure, which includes two oxide sub-layers and a nitride sub-layer between the oxide sub-layers. In some embodiments, the sub-layers of the buffer layer 155' are deposited in-situ.

Subsequently, the semiconductor substrates 100' are flipped and placed on the substrate 390, as shown in FIG. 5B in accordance with some embodiments. The carrier substrate 170 and the adhesive layer 180 are then removed. As shown in FIG. 5B, the buffer layer 160 is deposited over the substrate 390 and fills up the trenches 150 between the semiconductor substrates 100', in accordance with some embodiments. As a result, the connectors 140, the passivation layer 130, the dielectric layer 110, the buffer layer 155' and the semiconductor substrates 100' are surrounded by the buffer layer 160. The buffer layer 160 is separated from the semiconductor substrates 100', the dielectric layer 110, and the passivation layer 130 by the buffer layer 155'.

Afterwards, the substrate 390 is removed. The semiconductor substrates 100', the buffer layer 155' and the buffer layer 160 are attached to the substrate 200 through the adhesive layer 190, as shown in FIG. 5C. Afterwards, a singulation process is performed over the substrate 200 to form multiple semiconductor dies 300D, as shown in FIG. 5C. Each of the semiconductor dies 300D includes the semiconductor substrates 100', the dielectric layer 110, the conductive pads 120, the passivation layer 130, the connectors 140, the buffer layer 155', the buffer layer 160 and the adhesive layer 190. In some embodiments, the buffer layer 155' is sandwiched between the surface 100B of the semiconductor substrates 100' and the adhesive layer 190.

The steps described in FIGS. 1G-1K are performed sequentially to continue the fabrication of the package structure (not shown). In other words, the semiconductor dies 300A of the package structure described in FIG. 1K can be replaced with the semiconductor dies 300D so as to form another package structure.

Many variations and/or modifications can be made to embodiments of the disclosure. For example, FIGS. 1G-1K show that the buffer layer 160 and the connectors 140 of the semiconductor dies 300A are in direct contact with each other. However, embodiments of the disclosure are not limited thereto. The buffer layer 160 may be separated from the connectors 140 by additional features, such as one or more additional buffer layers.

FIGS. 6A-6D are cross-sectional views of various stages of a process for forming a package structure, in accordance with some embodiments. The materials and/or formation methods of the structure shown in FIGS. 6A-6D are the same as or similar to those of the structure shown in FIGS. 1A-1K, as illustrated in the aforementioned embodiments, and are not repeated.

Figure 6A:
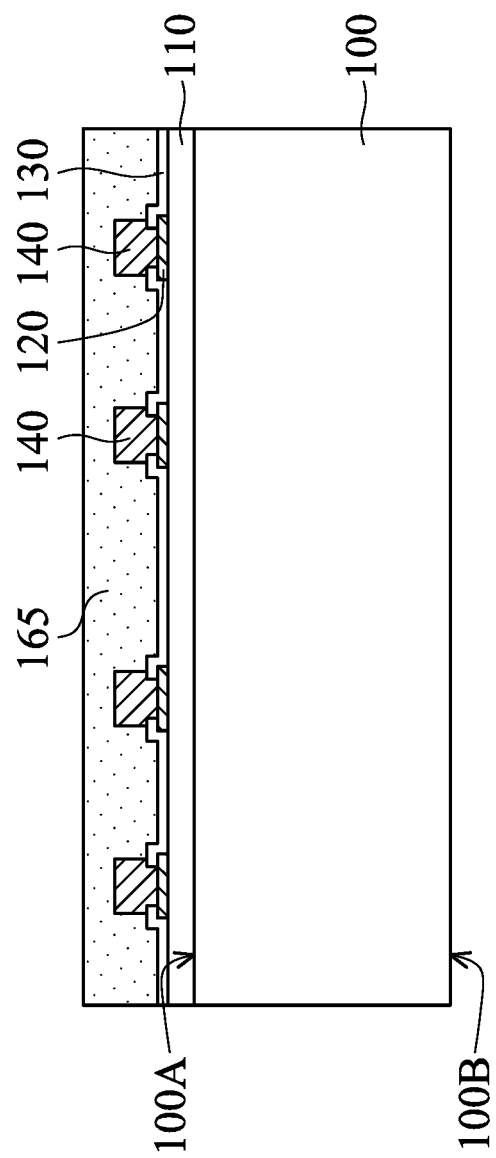
FIGS. 6A-6D are cross-sectional views of various stages of a process for forming a package structure, in accordance with some embodiments.

The structure shown in FIG. 1A is provided. A buffer layer 165 is then deposited over the passivation layer 130, as shown in FIG. 6A in accordance with some embodiments. The connectors 140 are surrounded and protected by the buffer layer 165. In some embodiments, the buffer layer 165 covers the connectors 140.

In some embodiments, the buffer layer 165 is made of PI, PBO, BCB, silicon oxide, silicon nitride, silicon oxynitride, another suitable dielectric material, or a combination thereof. In some embodiments, the buffer layer 165 has a CTE in a range from about 15 ppm/° C. to about 50 ppm/° C. However, embodiments of the disclosure are not limited thereto. In some embodiments, the buffer layer 165 is deposited using a spray coating process, a spin-on process, a CVD process, an ALD process, a PVD process, another applicable process, or a combination thereof.

Figure 6B:
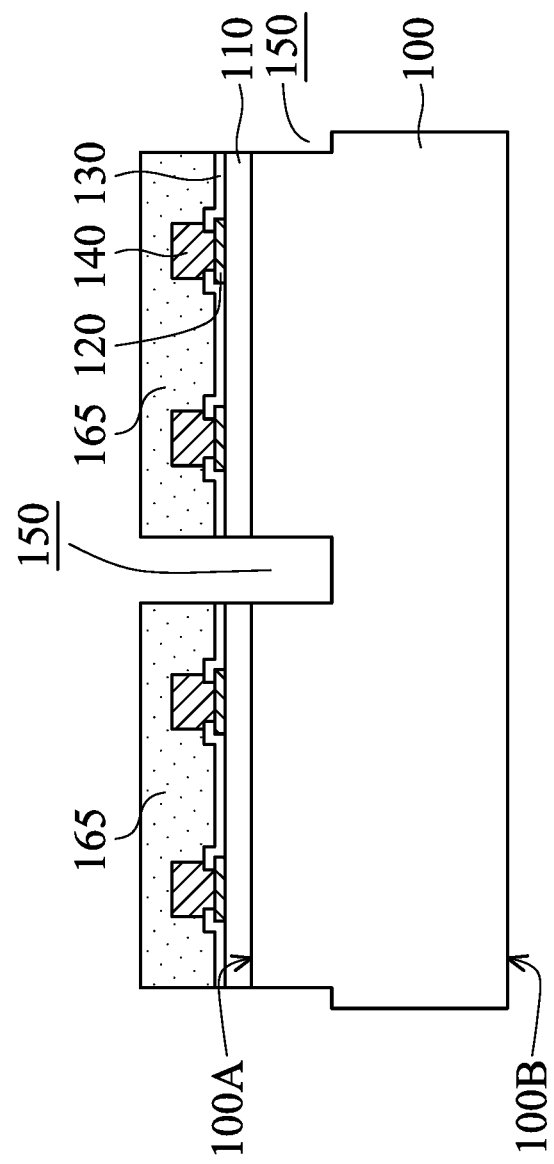

As shown in FIG. 6B, the buffer layer 165, the passivation layer 130, the dielectric layer 110 and the semiconductor substrate 100 are partially removed, in accordance with some embodiments. As a result, trenches 150 are formed in the buffer layer 165, the passivation layer 130, the dielectric layer 110 and the semiconductor substrate 100. The trenches 150 penetrate through the buffer layer 165, the passivation layer 130 and the dielectric layer 110, and extend from the surface 100A towards the surface 100B.

Figure 6C:
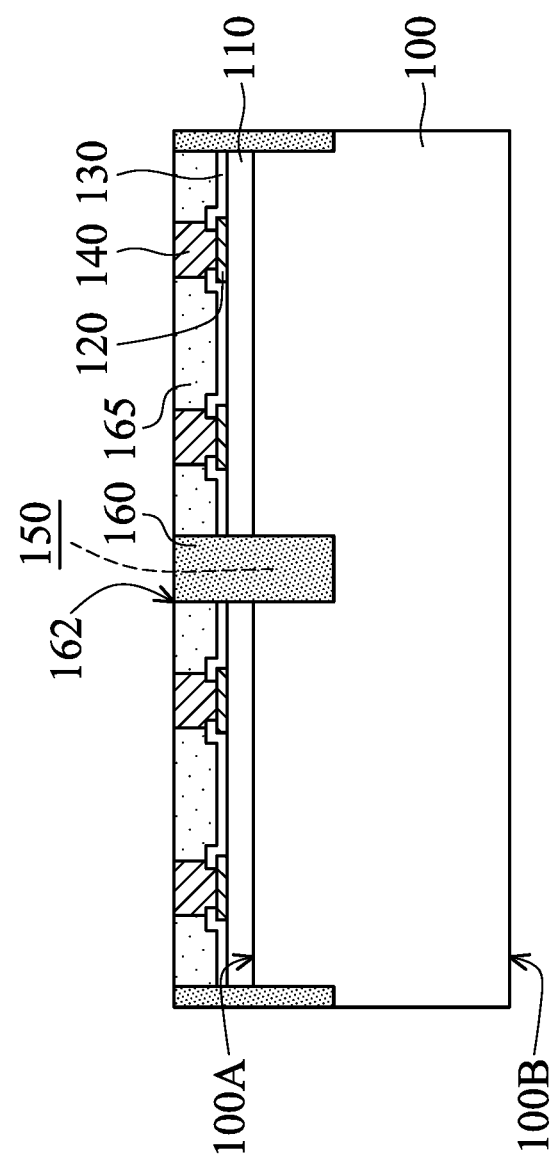

As shown in FIG. 6C, the buffer layer 160 is deposited and fills up the trenches 150, in accordance with some embodiments. As a result, the buffer layer 165, the passivation layer 130, the dielectric layer 110 and the semiconductor substrate 100 are surrounded by the buffer layer 160. In some embodiments, there is an interface 162 between the buffer layer 165 and the buffer layer 160. The interface 162 can be observed using an electron microscope.

In some embodiments, the deposited buffer layer 160 covers the buffer layer 165 (not shown). A planarization process is subsequently performed over the deposited buffer layer 160 until the connectors 140 are exposed by the buffer layer 165 and the buffer layer 160. The planarization process includes a grinding process, a CMP process, an etching process, another applicable process, or a combination thereof.

Figure 6D:
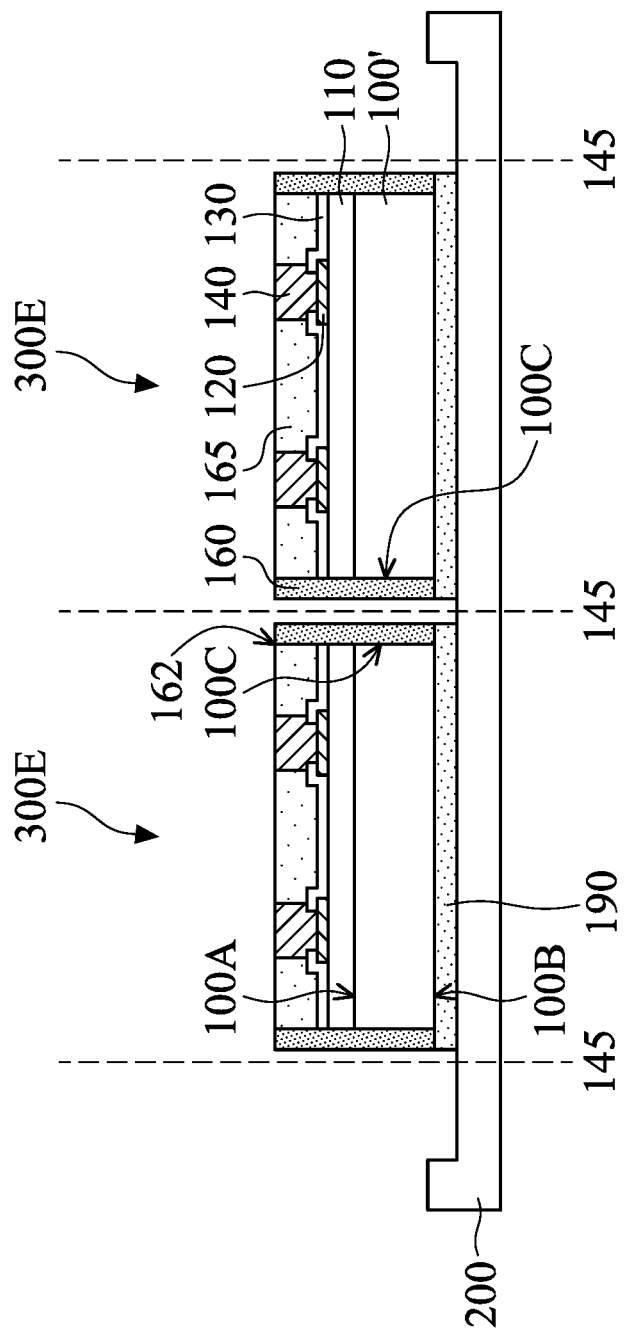

Afterwards, the steps described in FIGS. 1D-1G are performed sequentially. As a result, multiple semiconductor dies 300E are formed, as shown in FIG. 6D. Each of the semiconductor dies 300E includes the semiconductor substrates 100', the dielectric layer 110, the conductive pads 120, the passivation layer 130, the connectors 140, the buffer layer 165, the buffer layer 160 and the adhesive layer 190. In some embodiments, the interface 162 between the buffer layer 165 and the buffer layer 160 is substantially coplanar with the sidewalls 100C of the semiconductor substrates 100'.

Afterwards, the steps described in FIGS. 1H-1K are performed sequentially to continue the fabrication of the package structure (not shown). In other words, the semiconductor dies 300A of the package structure described in FIG. 1K can be replaced with the semiconductor dies 300E so as to form another package structure.

Many variations and/or modifications can be made to embodiments of the disclosure. One or more additional operations can be provided after the stage described in FIG. 6B and before the stage described in FIG. 6C. For example, in some embodiments, a surface treatment is performed over the structure shown in FIG. 6B. The surface treatment may be an oxidation process. As a result, the exposed surfaces of the semiconductor substrate 100 are oxidized to form a buffer layer, which is the same as or similar to the buffer layer 155 described in FIG. 3A. In some other embodiments, a deposition process is performed over the structure shown in FIG. 6B to deposit a buffer layer, which is the same as or similar to the buffer layer 155' described in FIG. 4A. Subsequently, the buffer layer 160 is deposited over the buffer layer, which is formed using a surface treatment or a deposition process, to continue the fabrication of the package structure.

Embodiments of the disclosure provide package structures and methods for forming the same. A package structure includes a semiconductor die surrounded by an encapsulation layer, and a redistribution structure over the semiconductor die and the encapsulation layer. A buffer layer (or multiple buffer layers) is between a sidewall of the semiconductor die and the encapsulation layer. The buffer layer(s) relieves or balances strain and stress, which may result from CTE mismatch between heterogeneous materials in the package structure and/or shrinkage of the encapsulation layer and passivation layers of the redistribution structure. As a result, the package structure is prevented from developing defects due to CTE mismatch and shrinkage, such as delamination between heterogeneous materials, cracking at the corners and/or edges of the semiconductor die, or deformation of the redistribution structure.

In accordance with some embodiments, a package structure is provided. The package structure includes an adhesive layer and a semiconductor substrate over the adhesive layer. The package structure also includes a connector over the semiconductor substrate. The package structure further includes a first buffer layer surrounding the connector. In addition, the package structure includes an encapsulation layer surrounding the first buffer layer. The first buffer layer is sandwiched between the encapsulation layer and the semiconductor substrate, and a sidewall of the encapsulation layer is in direct contact with a sidewall of the first buffer layer and a sidewall of the adhesive layer. The package structure also includes a redistribution layer over the first buffer layer and the encapsulation layer.

In accordance with some embodiments, a package structure is provided. The package structure includes a semiconductor substrate over an adhesive layer. The package structure also includes a first buffer layer over the adhesive layer. The first buffer layer overlies a sidewall of the semiconductor substrate. The package structure further includes a connector over the semiconductor substrate. In addition, the package structure includes an encapsulation layer surrounding the adhesive layer, the first buffer layer and the connector. The encapsulation layer covers a sidewall of the first buffer layer and a sidewall of the adhesive layer. The package structure also includes a passivation layer over the connector and the encapsulation layer.

In accordance with some embodiments, a package structure is provided. The package structure includes a semiconductor substrate over an adhesive layer. The package structure also includes a connector over the semiconductor substrate. The package structure further includes a first buffer layer covering a top surface of the semiconductor substrate and a sidewall of the connector. In addition, the package structure includes a second buffer layer covering a sidewall of the semiconductor substrate and a sidewall of the first buffer layer. An interface between the first buffer layer and the second buffer layer is overlapped with the adhesive layer. The package structure also includes an encapsulation layer surrounding the second buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
an adhesive layer;
a semiconductor substrate over the adhesive layer;
a connector over the semiconductor substrate;
a first buffer layer surrounding the connector;
an encapsulation layer surrounding the first buffer layer, wherein the first buffer layer is sandwiched between the encapsulation layer and the semiconductor substrate, and a sidewall of the encapsulation layer is in direct contact with a sidewall of the first buffer layer and a sidewall of the adhesive layer, wherein an interface between the adhesive layer and the encapsulation layer is substantially coplanar with an interface between the first buffer layer and the encapsulation layer; and
a redistribution layer over the first buffer layer and the encapsulation layer.

2. The package structure as claimed in claim 1, wherein a portion of the adhesive layer extends outwardly from a sidewall of the semiconductor substrate.

3. The package structure as claimed in claim 2, wherein the first buffer layer overlies the portion of the adhesive layer extending outwardly from the sidewall of the semiconductor substrate.

4. The package structure as claimed in claim 1, further comprising a second buffer layer covering a sidewall of the semiconductor substrate, wherein the first buffer layer surrounds the second buffer layer.

5. The package structure as claimed in claim 4, wherein the second buffer layer extends between the first buffer layer and the connector over a top surface of the semiconductor substrate.

6. The package structure as claimed in claim 4, wherein the second buffer layer extends from the sidewall of the semiconductor substrate to a bottom surface of the semiconductor substrate.

7. The package structure as claimed in claim 1, further comprising a second buffer layer over a top surface of the semiconductor substrate, wherein the connector is embedded in the second buffer layer and separated from the first buffer layer by the second buffer layer.

8. A package structure, comprising:
a semiconductor substrate over an adhesive layer;
a first buffer layer over the adhesive layer, wherein the first buffer layer overlies a sidewall of the semiconductor substrate;
a second buffer layer over the adhesive layer, wherein the adhesive layer is in direct contact with the first buffer layer and the second buffer layer, and the semiconductor substrate is separated from the adhesive layer by the second buffer layer;
a connector over the semiconductor substrate;
an encapsulation layer surrounding the adhesive layer, the first buffer layer and the connector, wherein the encapsulation layer covers a sidewall of the first buffer layer and a sidewall of the adhesive layer; and
a passivation layer over the connector and the encapsulation layer.

9. The package structure as claimed in claim 8, wherein the first buffer layer extends from the sidewall of the semiconductor substrate to the connector.

10. The package structure as claimed in claim 8, wherein the first buffer layer is attached to the sidewall of the semiconductor substrate through the second buffer layer.

11. The package structure as claimed in claim 8, wherein the second buffer extends along the sidewall of the semiconductor substrate and is covered by the first buffer layer.

12. The package structure as claimed in claim 8, wherein the sidewall of the adhesive layer is substantially aligned with the sidewall of the first buffer layer.

13. A package structure, comprising:
a semiconductor substrate over an adhesive layer;
a connector over the semiconductor substrate;
a first buffer layer covering a top surface of the semiconductor substrate and a sidewall of the connector;
a second buffer layer covering a sidewall of the semiconductor substrate and a sidewall of the first buffer layer, wherein an interface between the first buffer layer and the second buffer layer is overlapped with the adhesive layer; and
an encapsulation layer surrounding the second buffer layer, wherein a sidewall of the encapsulation layer is in direct contact with a sidewall of the second buffer layer and a sidewall of the adhesive layer.

14. The package structure as claimed in claim 13, wherein the interface is substantially coplanar with the sidewall of the semiconductor substrate.

15. The package structure as claimed in claim 13, wherein top surfaces of the first buffer layer, the second buffer layer and the connector are substantially level with one another.

16. The package structure as claimed in claim 13, wherein a bottom surface of the semiconductor substrate is substantially level with a bottom surface of the second buffer layer.

17. The package structure as claimed in claim 13, wherein a sidewall of the adhesive layer is substantially aligned with a sidewall of the second buffer layer.

18. The package structure as claimed in claim 13, further comprising a passivation layer over the first buffer layer, the second buffer layer and the encapsulation layer.

19. The package structure as claimed in claim 18, wherein the passivation layer is in direct contact with the first buffer layer and the second buffer layer.

20. The package structure as claimed in claim 13, wherein a top surface of the first buffer layer is substantially level with a top surface of the second buffer layer.

* * * * *